(12) United States Patent
Hara et al.

(10) Patent No.: US 12,513,945 B2
(45) Date of Patent: Dec. 30, 2025

(54) ACTIVE MATRIX SUBSTRATE AND METHOD FOR MANUFACTURING SAME

(71) Applicant: Sharp Display Technology Corporation, Kameyama (JP)

(72) Inventors: Kengo Hara, Kameyama (JP); Tohru Daitoh, Kameyama (JP); Tetsuo Kikuchi, Kameyama (JP); Masahiko Suzuki, Kameyama (JP); Setsuji Nishimiya, Kameyama (JP); Hitoshi Takahata, Kameyama (JP)

(73) Assignee: SHARP DISPLAY TECHNOLOGY CORPORATION, Kameyama (JP)

( * ) Notice: Subject to any disclaimer, the term of this patent is extended or adjusted under 35 U.S.C. 154(b) by 632 days.

(21) Appl. No.: 17/895,226

(22) Filed: Aug. 25, 2022

(65) Prior Publication Data
US 2023/0075289 A1  Mar. 9, 2023

(30) Foreign Application Priority Data

Aug. 30, 2021  (JP) ................................ 2021-139961

(51) Int. Cl.
*H10D 30/67* (2025.01)
*H10D 30/01* (2025.01)
(Continued)

(52) U.S. Cl.
CPC ....... *H10D 30/6755* (2025.01); *H10D 30/031* (2025.01); *H10D 30/6729* (2025.01);
(Continued)

(58) Field of Classification Search
CPC ........... H10D 30/6755; H10D 30/6757; H10D 30/6729; H10D 30/031; H10K 59/1201; H10K 59/1213
See application file for complete search history.

(56) References Cited

U.S. PATENT DOCUMENTS

2011/0012117 A1*  1/2011  Yamazaki ............. H10D 64/62
                                                       257/E27.111
2012/0138922 A1   6/2012  Yamazaki et al.
(Continued)

FOREIGN PATENT DOCUMENTS

JP   2003-223120 A   8/2003
JP   2012-134475 A   7/2012
(Continued)

*Primary Examiner* — Jeff W Natalini
*Assistant Examiner* — Andrew Zabel
(74) *Attorney, Agent, or Firm* — Keating & Bennett, LLP

(57) ABSTRACT

An active matrix substrate includes: a first oxide semiconductor layer including a first channel region; a first gate electrode disposed on the substrate side of the first oxide semiconductor layer; a channel protection layer disposed on a side of the first oxide semiconductor layer opposite to the substrate and covering the first channel region; a first TFT having a first source electrode and a first drain electrode in an upper layer of the channel protection layer; a second oxide semiconductor layer; a second gate electrode disposed on a side of the second oxide semiconductor layer opposite to the substrate; and the second TFT having a second source electrode and a second drain electrode disposed on an interlayer insulating layer that covers the second gate electrode, wherein the first oxide semiconductor layer and the second oxide semiconductor layer are formed of the same layered oxide semiconductor film, the layered oxide semiconductor film has a layered structure including a high mobility oxide semiconductor film and a low mobility oxide semiconductor film disposed on the substrate side of the high mobility oxide semiconductor film and having a lower mobility than a mobility of the high mobility oxide semiconductor film, and the channel protection layer of the first TFT and the gate insulating layer of the second TFT are formed of the same insulating film.

15 Claims, 29 Drawing Sheets

(51) Int. Cl.
*H10K 59/121* (2023.01)
*H10K 59/12* (2023.01)

(52) U.S. Cl.
CPC ..... *H10D 30/6757* (2025.01); *H10K 59/1213* (2023.02); *H10K 59/1201* (2023.02)

(56) References Cited

U.S. PATENT DOCUMENTS

| | | | |
|---|---|---|---|
| 2013/0320334 | A1 | 12/2013 | Yamazaki et al. |
| 2014/0286076 | A1 | 9/2014 | Aoki et al. |
| 2017/0092178 | A1* | 3/2017 | Lee ................. H10D 86/471 |
| 2019/0013333 | A1* | 1/2019 | Inoue ................ G02F 1/1339 |
| 2019/0123119 | A1 | 4/2019 | Miyamoto et al. |
| 2019/0326443 | A1* | 10/2019 | Suzuki ............ G02F 1/134363 |
| 2020/0089064 | A1* | 3/2020 | Morinaga ........... G02F 1/1368 |
| 2020/0089069 | A1* | 3/2020 | Morinaga ......... H10K 59/1213 |
| 2020/0168638 | A1* | 5/2020 | Je ................. H10D 30/6731 |
| 2020/0243568 | A1* | 7/2020 | Oda .................... G09F 9/30 |
| 2022/0208793 | A1* | 6/2022 | Takahata ........... H10D 30/6755 |
| 2023/0252951 | A1* | 8/2023 | Hara ................ H10D 86/423 |
| | | | 345/87 |

FOREIGN PATENT DOCUMENTS

| | | |
|---|---|---|
| JP | 2014-007399 A | 1/2014 |
| JP | 2014-209727 A | 11/2014 |
| JP | 2015-109315 A | 6/2015 |
| JP | 2019-078788 A | 5/2019 |
| JP | 2020-047920 A | 3/2020 |
| JP | 6806956 B1 | 1/2021 |

\* cited by examiner

ACTIVE MATRIX SUBSTRATE AND METHOD FOR MANUFACTURING SAME

CROSS-REFERENCE TO RELATED APPLICATIONS

This application claims the benefit of priority to Japanese Patent Application Number 2021-139961 filed on Aug. 30, 2021. The entire contents of the above-identified application are hereby incorporated by reference.

BACKGROUND

Technical Field

The disclosure relates to an active matrix substrate and a method for Manufacturing same.

An active matrix substrate used in a liquid crystal display device, an organic electroluminescence (EL) display device, or the like includes a display region including a plurality of pixels, and a region other than the display region (a non-display region or a frame region). The display region includes a switching element such as a Thin Film Transistor (hereinafter referred to as a "TFT") for each of the pixels. As such a switching element, in the related art, a TFT including an amorphous silicon film serving as an active layer (hereinafter referred to as an "amorphous silicon TFT") and a TFT including a polycrystalline silicon film serving as an active layer (hereinafter referred to as a "polycrystalline silicon TFT") have been widely used.

There is proposed use of an oxide semiconductor as a material of the active layer of the TFT, in place of amorphous silicon and polycrystalline silicon. Such a TFT is referred to as an "oxide semiconductor TFT". The oxide semiconductor has a higher mobility than amorphous silicon. Thus, the oxide semiconductor TFT can operate at a higher speed than the amorphous silicon TFT.

A structure of the TFT is roughly classified into a bottom gate structure and a top gate structure. Currently, the bottom gate structure is often adopted for the oxide semiconductor TFT, but it is also proposed to use the top gate structure (see, for example, JP 2015-109315 A). In the top gate structure, the gate insulating layer can be thinned, resulting in high current supply performance.

In the non-display region of the active matrix substrate, peripheral circuits including a TFT may be monolithically (integrally) formed. For example, by forming a drive circuit monolithically, the non-display region is narrowed and the mounting process is simplified, resulting in cost reduction. In the non-display region, a gate drive circuit may be formed monolithically, and a source drive circuit may be mounted by a chip on glass (COG) process. In devices such as smartphones, where there is a high demand for narrowing the frame, a demultiplexer circuit, which is also referred to as a source shared driving (SSD) circuit, may be formed monolithically.

In the present specification, a TFT disposed in each pixel of the display region (in the active matrix substrate used in an organic EL display device, a plurality of TFTs constituting a pixel circuit) is referred to as a "pixel TFT". In addition, a TFT constituting a peripheral circuit provided in the non-display region is referred to as a "peripheral circuit TFT".

In the active matrix substrate, from the perspective of the manufacturing process, it is preferable that the peripheral circuit TFT be also formed by using the same oxide semiconductor film as the pixel TFT and by using a common process. Thus, the peripheral circuit TFT and the pixel TFT usually have the same structure. The characteristics of these TFTs can also be substantially the same.

SUMMARY

However, characteristics required for the peripheral circuit TFT and the pixel TFT are different from each other. In addition, among peripheral circuit TFTs, required characteristics are different depending on the intended use.

Further, in the active matrix substrate used in the organic EL display device, a pixel circuit including at least two types of pixel TFTs (referred to as a "drive pixel TFT" and a "selection pixel TFT") is provided in one pixel. The selection pixel TFT has a function of selecting a pixel by changing voltage applied to the drive pixel TFT. The drive pixel TFT has a function of supplying a current required for light emission. The selection pixel TFT and the drive pixel TFT have different functions, and thus the characteristics required for the selection pixel TFT and the drive pixel TFT may also be different.

As described above, in an active matrix substrate provided with a plurality of TFTs having different uses, it is required to separately produce a plurality of oxide semiconductor TFTs having different characteristics so that each TFT can have the required characteristics according to the use.

An embodiment of the disclosure has been conceived in light of the above-described circumstances, and an object of the disclosure is to provide an active matrix substrate including a plurality of oxide semiconductor TFTs having different characteristics from one another.

An active matrix substrate and a method for manufacturing the active matrix substrate are disclosed in the present specification, in the following items.

Item 1

An active matrix substrate including: a substrate; and a plurality of oxide semiconductor TFTs supported by the substrate and including a first TFT and a second TFT,
wherein the first TFT includes
a first oxide semiconductor layer including a first channel region,
a first gate electrode disposed on the substrate side of the first oxide semiconductor layer with a lower insulating layer interposed between the first gate electrode and the first oxide semiconductor layer, the first gate electrode overlapping with the first channel region when viewed from a normal direction of the substrate,
a channel protection layer disposed on a side of the first oxide semiconductor layer opposite to the substrate and covering at least the first channel region, and
a first source electrode and a first drain electrode disposed in an upper layer of the channel protection layer and electrically connected to the first oxide semiconductor layer,
the second TFT includes
a second oxide semiconductor layer including a second channel region,
a second gate electrode disposed on a side of the second oxide semiconductor layer opposite to the substrate with a gate insulating layer interposed between the second gate electrode and the second oxide semiconductor layer, the second gate electrode overlapping with the second channel region when viewed from the normal direction of the substrate, and
a second source electrode and a second drain electrode disposed on an interlayer insulating layer covering the second gate electrode and electrically connected to the second oxide semiconductor layer, the first oxide semiconductor layer and the second oxide semiconductor layer are formed of the same layered oxide semiconductor film, and the layered oxide semiconductor film has a layered structure including a high mobility oxide semiconductor film having a relatively high mobility and a low mobility oxide semiconductor film disposed on the substrate side of the high mobility oxide semiconductor film and having a lower mobility than a mobility of the high mobility oxide semiconductor film, and the channel protection layer of the first TFT and the gate insulating layer of the second TFT are formed of the same insulating film.

Item 2

The active matrix substrate according to item 1, wherein a thickness of the lower insulating layer is larger than a thickness of the gate insulating layer.

Item 3

The active matrix substrate according to item 1 or 2, wherein the second TFT further includes a lower conductive layer formed of the same conductive film as the first gate electrode of the first TFT, and the lower conductive layer overlaps with at least a part of the second oxide semiconductor layer when viewed from the normal direction of the substrate.

Item 4

The active matrix substrate according to item 3, wherein the lower conductive layer is electrically connected to the second gate electrode and functions as a lower gate electrode of the second TFT.

Item 5

The active matrix substrate according to any one of items 1 to 4, wherein at least one of the first source electrode or the first drain electrode of the first TFT is formed of the same conductive film as the second gate electrode of the second TFT.

Item 6

The active matrix substrate according to any one of items 1 to 5, wherein at least one of the first source electrode or the first drain electrode of the first TFT and the second source electrode and the second drain electrode of the second TFT are formed of the same conductive film.

Item 7

The active matrix substrate according to any one of items 1 to 6, wherein at least one of the first source electrode or the first drain electrode of the first TFT is an electrode formed of the same conductive film as the second gate electrode of the second TFT, and the electrode is electrically connected to an upper electrode formed of the same conductive film as the second source electrode and the second drain electrode of the second TFT.

Item 8

The active matrix substrate according to any one of items 1 to 7, wherein the channel protection layer of the first TFT and the gate insulating layer of the second TFT are separated from each other.

Item 9

The active matrix substrate according to any one of items 1 to 7, wherein the channel protection layer of the first TFT and the gate insulating layer of the second TFT are connected to each other.

Item 10

The active matrix substrate according to item 9, wherein the insulating film includes a source-side opening and a drain-side opening located on both sides of the gate insulating layer when viewed from the normal direction of the substrate, the source-side opening and the drain-side opening exposing a part of the second oxide semiconductor layer.

Item 11

The active matrix substrate according to any one of items 1 to 10, wherein the first oxide semiconductor layer further includes a first source contact region and a first drain contact region located on both sides of the first channel region when viewed from the normal direction of the substrate, the first source contact region is electrically connected to the first source electrode, the first drain contact region is electrically connected to the first drain electrode, the channel protection layer covers the first channel region of the first oxide semiconductor layer and exposes the first source contact region and the first drain contact region, the second oxide semiconductor layer includes a second source contact region and a second drain contact region located on both sides of the second channel region when viewed from the normal direction of the substrate, the second source contact region is electrically connected to the second source electrode, the second drain contact region is electrically connected to the second drain electrode, and the gate insulating layer covers a first region of the second oxide semiconductor layer, the first region including the second channel region, and exposes a second region including the second source contact region and the second drain contact region.

Item 12

The active matrix substrate according to item 11, wherein in the second oxide semiconductor layer, the second region is a region having a lower specific resistance than a specific resistance of the first region, and in the first oxide semiconductor layer, the first source contact region and the first drain contact region are regions having a lower specific resistance than a specific resistance of a portion covered with the channel protection layer.

Item 13

The active matrix substrate according to item 12, wherein the first region includes the second channel region overlapping with the second gate electrode and a side region overlapping with the gate insulating layer but not overlapping with the second gate electrode, when viewed from the normal direction of the substrate, the side region is located between the second channel region and the second source contact region and the second drain contact region, and a specific resistance of the second channel region is greater than a specific resistance of the side region and a specific resistance of the first channel region.

Item 14
   The active matrix substrate according to any one of items 1 to 13 further including a display region including a plurality of pixel areas and a non-display region arranged around the display region,
      wherein each of the plurality of pixel areas includes a pixel circuit including a selection pixel TFT, a drive pixel TFT, and a capacitance element,
      the drive pixel TFT is the first TFT, and
      the selection pixel TFT is the second TFT.
Item 15
   The active matrix substrate according to any one of items 1 to 13, further including:
      a display region including a plurality of pixel areas;
      a non-display region arranged around the display region;
      a pixel TFT arranged in each of the plurality of pixel areas; and
      a peripheral circuit arranged in the non-display region and including a plurality of circuit TFTs,
      wherein the pixel TFT is the first TFT, and
      the plurality of circuit TFTs include the second TFT.
Item 16
   The active matrix substrate according to any one of items 1 to 15,
      wherein each of the low mobility oxide semiconductor film and the high mobility oxide semiconductor film includes an In—Ga—Zn—O based semiconductor, and
      an atomic ratio of In to all metal elements in the high mobility oxide semiconductor film is greater than an atomic ratio of In to all metal elements in the low mobility oxide semiconductor film.
Item 17
   The active matrix substrate according to any one of items 1 to 15,
      wherein the high mobility oxide semiconductor film includes Sn, and
      the low mobility oxide semiconductor film does not include Sn or includes Sn at a lower concentration than a concentration of Sn in the high mobility oxide semiconductor film.
Item 18
   The active matrix substrate according to any one of claims 1 to 15,
      wherein the low mobility oxide semiconductor film and/or the high mobility oxide semiconductor film includes an In—Ga—Zn—O based semiconductor, and
      the In—Ga—Zn—O based semiconductor includes a crystalline portion.
Item 19
   A method for manufacturing the active matrix substrate according to any one of items 1 to 18, the method including
      performing, in a state in which at least a part of the first oxide semiconductor layer is covered with the channel protection layer and a part of the second oxide semiconductor layer is covered with the gate insulating layer, processing for lowering a resistance of the layered oxide semiconductor film to make a specific resistance of a portion of the second oxide semiconductor layer, the portion being not covered with the gate insulating layer, less than specific resistances of a portion of the first oxide semiconductor layer, the portion being covered with the channel protection layer, and a portion of the second oxide semiconductor layer, the portion being covered with the gate insulating layer.

According to an embodiment of the disclosure, an active matrix substrate including a plurality of oxide semiconductor TFTs having different characteristics is provided.

BRIEF DESCRIPTION OF DRAWINGS

The disclosure will be described with reference to the accompanying drawings, wherein like numbers reference like elements.

DESCRIPTION OF EMBODIMENTS

TFTs provided in an active matrix substrate have different required characteristics depending on respective uses. Examples of suitable TFT characteristics will be described below. Note that the uses and required characteristics of the TFTs are not limited to the examples described below, and diversify.

As described above, in the active matrix substrate used in an organic EL display device, a pixel circuit including at least a drive pixel TFT and a selection pixel TFT is provided in one pixel. From the perspective of current control and in order to suitably perform multi-gray scale display, it is preferable that the Vg-Id (Vg represents a gate voltage and Id represents a drain current) characteristic of the drive pixel TFT be gentle (that is, not steep) to some extent. For this reason, the drive pixel TFT is required to have a large subthreshold coefficient (S value). The drive pixel TFT may also have enhancement characteristics of having a positive threshold voltage. On the other hand, the selection pixel TFT preferably has a high mobility (i.e., a large ON-current). The selection pixel TFT need not have a large S value. Rather, the selection pixel TFT is required to have a small S value (that is, the Vg-Id characteristic is steep) and a high switching speed. The selection pixel TFT may have depletion characteristics of having a negative threshold voltage.

For peripheral circuit TFTs as well, characteristics required for the TFTs are different depending on intended uses and functions. For example, among the peripheral circuit TFTs, a TFT used in a demultiplexer circuit (hereinafter, a "DMX circuit TFT") and some TFTs constituting a drive circuit (e.g., an output transistor) are required to have a high current driving force because a relatively large ON-current needs to be flown therein.

As a result of studies based on the above knowledge, the present inventors have found a method for separately producing a plurality of TFTs having different characteristics from one another by using the same oxide semiconductor film as an active layer and making TFT structures different from one another, which has achieved the disclosure. Specifically, a bottom gate TFT and a top gate TFT are separately produced, and a layered film of a high mobility oxide semiconductor film and a low mobility oxide semiconductor film is used as an oxide semiconductor film. As a result, oxide semiconductor films primarily contributing to a channel can be made different between the bottom gate TFT and the top gate TFT, and thus each TFT can be controlled to have a desired characteristic.

First Embodiment

An active matrix substrate of the present embodiment includes a substrate and a plurality of oxide semiconductor TFTs supported by the substrate. Each of the plurality of oxide semiconductor TFTs includes at least one first TFT and at least one second TFT. Hereinafter, the structure of each TFT will be described with reference to the drawings.

Figure 1A:
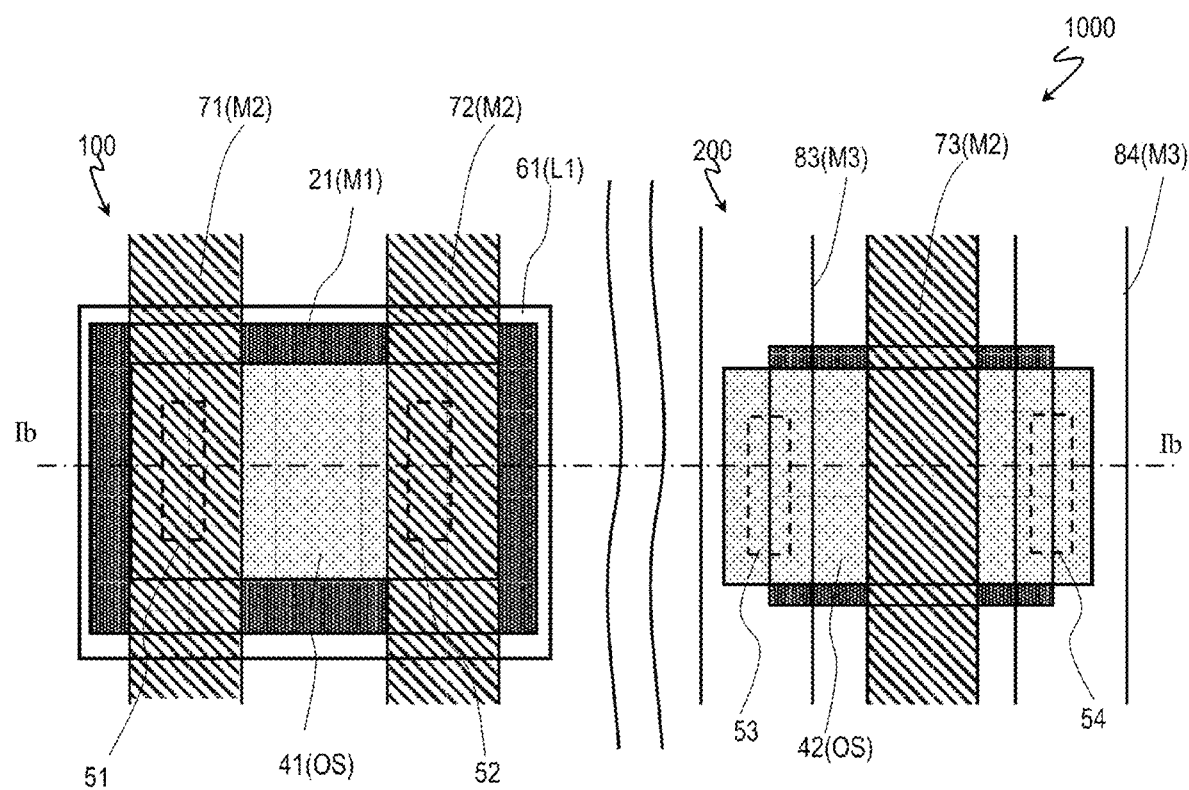
FIG. 1A is a plan view illustrating a first TFT 100 and a second TFT 200 in an active matrix substrate.
Figure 1B:
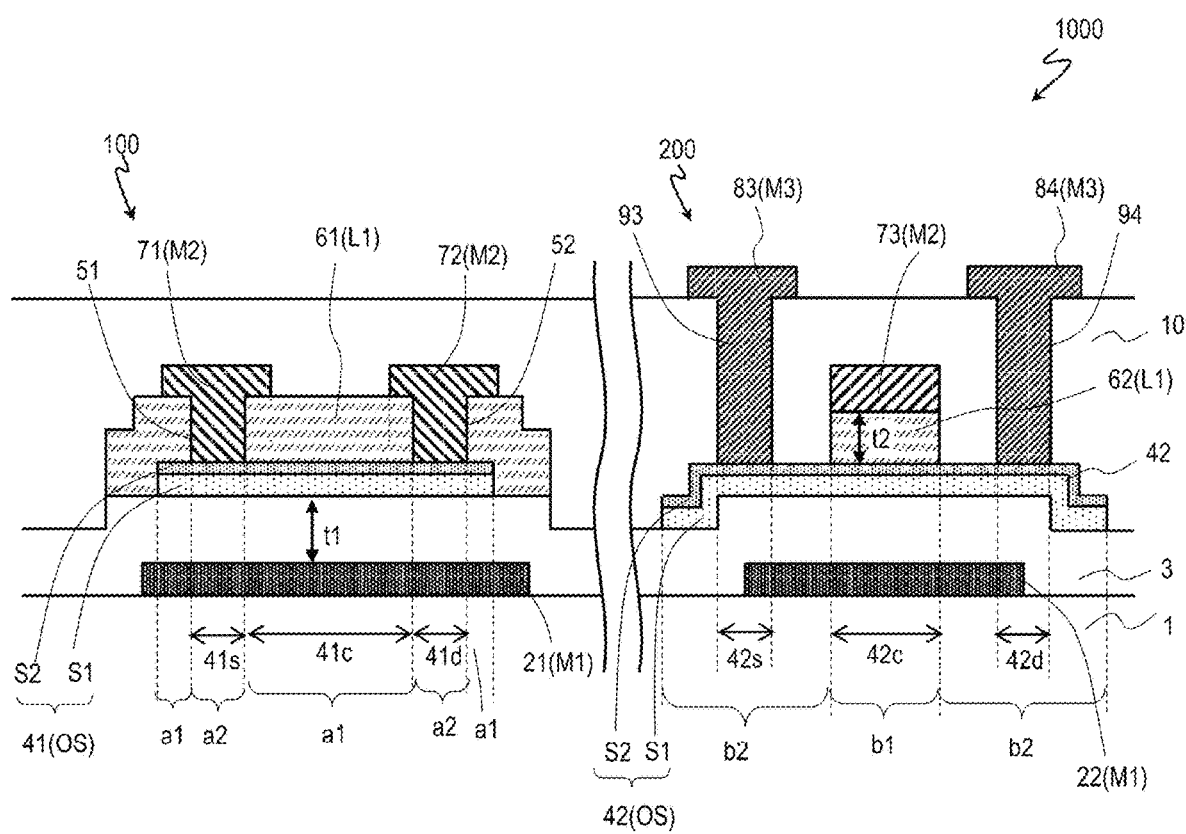
FIG. 1B is a cross-sectional view taken along a line Ib-Ib illustrated in FIG. 1A.

FIG. 1A and FIG. 1B are a plan view and a cross-sectional view illustrating a first TFT 100 and a second TFT 200 formed in an active matrix substrate 1000, respectively. The active matrix substrate 1000 may have a plurality of first TFTs 100 and a plurality of second TFTs 200. Here, for simplicity, only a single first TFT 100 and a single second TFT 200 are illustrated and described.

First, a layer structure of the active matrix substrate 1000 will be described. The active matrix substrate 1000 includes a first metal layer M1, a lower insulating layer 3, a layered oxide semiconductor film OS, a first insulating film L1, a second metal layer M2, an interlayer insulating layer 10, and a third metal layer M3 in this order from the substrate 1 side.

The layered oxide semiconductor film OS is a layered film including a low mobility oxide semiconductor film S1 and a high mobility oxide semiconductor film S2 disposed thereon. Note that the layered oxide semiconductor film OS only needs to include at least the low mobility oxide semiconductor film S1 and the high mobility oxide semiconductor film S2 in this order, and may have a layered structure of three or more layers.

Each metal layer is a layer including electrodes, wiring lines, and the like formed of the same conductive film. A source bus line formed in the active matrix substrate 1000 may be formed in any of the first metal layer M1 to the third metal layer M3, and a gate bus line may be formed in a metal layer different from the metal layer in which the source bus line is formed, of the first metal layer M1 to the third metal layer M3. For example, the gate bus line may be formed in the first metal layer M1, and the source bus line may be formed in the second metal layer M2. Alternatively, the gate bus line may be formed in the second metal layer M2 and the source bus line may be formed in the third metal layer M3.

In the drawings, a reference sign for each constituent element may be followed by a sign indicating the metal layer or the insulating film in parenthesis. For example, "(M1)" may be added after the reference sign of the electrode or wiring line formed in the first metal layer M1.

In the present embodiment, the first TFT 100 is a bottom gate TFT, and the second TFT 200 is a top gate TFT. The first TFT 100 may be, for example, a drive pixel TFT of a pixel circuit, and the second TFT 200 may be, for example, a selection pixel TFT.

The first TFT 100 includes a gate electrode 21, an oxide semiconductor layer 41 disposed on the gate electrode 21 with a lower insulating layer 3 interposed therebetween, a channel protection layer (etch stop layer) 61 covering at least a part of the oxide semiconductor layer 41, and a source electrode 71 and a drain electrode 72. A gate electrode, an oxide semiconductor layer, a source electrode, and a drain electrode in the first TFT 100 are sometimes referred to as a "first gate electrode", a "first oxide semiconductor layer", a "first source electrode", and a "first drain electrode", respectively.

The gate electrode 21 is formed in the first metal layer M1. In the first TFT 100, the lower insulating layer 3 is located between the gate electrode 21 and the oxide semiconductor layer 41, and functions as a gate insulating layer.

The oxide semiconductor layer 41 is formed of the layered oxide semiconductor film OS including the low mobility oxide semiconductor film S1 and the high mobility oxide semiconductor film S2 disposed on the low mobility oxide semiconductor film S1.

The oxide semiconductor layer 41 includes a channel region 41c, and a source contact region 41s and a drain contact region 41d that are positioned respectively on both sides of the channel region 41c, when viewed from a normal direction of the substrate 1. The source contact region 41s is a region electrically connected to the source electrode 71, and the drain contact region 41d is a region electrically connected to the drain electrode 72. The channel region 41c refers to a region that is located between the source contact region 41s and the drain contact region 41d and overlaps with the gate electrode 21, when viewed from the normal direction of the substrate 1.

The channel protection layer 61 is formed of the first insulating film L1. The channel protection layer 61 preferably covers at least an upper surface of the channel region 41c of the oxide semiconductor layer 41. The channel protection layer 61 may be in direct contact with the channel region 41c. In the illustrated example, the channel protection layer 61 includes openings 51, 52 that expose the source contact region 41s and the drain contact region 41d, respectively. The channel protection layer 61 may cover the entire portion of the upper surface of the oxide semiconductor layer 41 other than the source contact region 41s and the drain contact region 41d. In addition, the channel protection layer 61 may cover the entire side surface of the oxide semiconductor layer 41. This makes it possible to more effectively reduce damage to the oxide semiconductor layer 41 caused by patterning of the second metal layer M2. As illustrated in FIG. 1A, the channel protection layer 61 has an island-shaped pattern slightly larger than the oxide semiconductor layer 41, and when viewed from the normal direction of the substrate 1, the oxide semiconductor layer 41 may be located inside the channel protection layer 61.

The source electrode 71 and the drain electrode 72 are formed in the second metal layer M2. In this example, the source electrode 71 is disposed on the channel protection layer 61 and in the opening 51, and is connected to the source contact region 41s in the opening 51. The drain electrode 72 is disposed on the channel protection layer 61 and in the opening 52, and is connected to the drain contact region 41d in the opening 52.

The source contact region 41s and the drain contact region 42d in the oxide semiconductor layer 41 are reduced by being in direct contact with the electrodes in the second metal layer M2, and may have a lower specific resistance than a specific resistance of the channel region 41c. In the present specification, when viewed from the normal direction of the substrate 1, a region a1 of the oxide semiconductor layer 41 (including at least the channel region 41c), which overlaps with the channel protection layer 61, is referred to as a "first region", a region a2 including the source contact region 41s and the drain contact region 42d and having a lower specific resistance than a specific resistance of the first region a1 is referred to as a "second region".

The channel protection layer 61, the source electrode 71, and the drain electrode 72 are covered with the interlayer insulating layer 10. At least the first region a1 of the oxide semiconductor layer 41 is covered with the channel protection layer 61, and thus is not in direct contact with the interlayer insulating layer 10. As a result, for example, even in a case where the interlayer insulating layer 10 is a reducing insulating film (e.g., an SiN film) that can reduce an oxide semiconductor, the first region a1 of the oxide semiconductor layer 41 including at least the channel region 41c can be suppressed from being reduced by the interlayer insulating layer 10, to be low-resistive. As illustrated, the entire oxide semiconductor layer 41 does not need to be in direct contact with the interlayer insulating layer 10. Further, in a step of processing for lowering a resistance (plasma processing or the like) described below, the channel protection layer 61 functions as a mask, so that the first region a1 can be suppressed from being low-resistive.

On the other hand, the second TFT 200 includes an oxide semiconductor layer 42, a gate insulating layer 62 disposed on a part of the oxide semiconductor layer 42, a gate electrode 73 disposed on the gate insulating layer 62, and a source electrode 83 and a drain electrode 84. A gate electrode, an oxide semiconductor layer, a source electrode, and a drain electrode in the second TFT 200 are sometimes referred to as a "second gate electrode", a "second oxide semiconductor layer", a "second source electrode", and a "second drain electrode".

The oxide semiconductor layer 42 is formed of the same layered oxide semiconductor film as the first TFT 100. That is, the oxide semiconductor layer 42 is formed of the layered oxide semiconductor film OS including the low mobility oxide semiconductor film S1 and the high mobility oxide semiconductor film S2 disposed on the low mobility oxide semiconductor film S1.

The oxide semiconductor layer 42 includes a channel region 42c, and a source contact region 42s and a drain contact region 42d that are disposed respectively on both sides of the channel region 42c, when viewed from the normal direction of the substrate 1. The source contact region 42s is a region electrically connected to the source electrode 83, and the drain contact region 42d is a region electrically connected to the drain electrode 84. The channel region 42c is a region that is located between the source contact region 42s and the drain contact region 42d and overlaps with the gate electrode 73, when viewed from the normal direction of the substrate 1.

The oxide semiconductor layer 42 also includes a first region b1 covered with the gate insulating layer 62 and a second region b2 not covered with the gate insulating layer 62. The first region b1 includes the channel region 42c. The second region b2 is a low-resistive region having a lower specific resistance than a specific resistance of the first region b1, and includes the source contact region 42s and the drain contact region 42d. The second region b2 in the second TFT 200 is, for example, a region that has been caused to be low-resistive by performing processing for lowering the resistance such as plasma processing on the oxide semiconductor layer 42 using the gate insulating layer 62 and the gate electrode 73 as a mask.

The gate insulating layer 62 is formed of the same first insulating film L1 as the channel protection layer 61 of the first TFT 100. The gate electrode 73 is formed in the same second metal layer M2 as the source electrode 71 and the drain electrode 72 of the first TFT 100 (i.e., formed using the same conductive film). In this example, an edge of the gate insulating layer 62 is aligned with an edge of the gate electrode 73, but in a cross section of the second TFT 200 in the channel length direction, the edge of the gate electrode 73 may be located inside the edge of the gate insulating layer 62. As described below, in a case where patterning of the second metal layer M2 is performed after patterning of the first insulating film L1, a width of the gate electrode 73 in the channel length direction can be set to be smaller than a width of the gate insulating layer 62 in the channel width direction.

The oxide semiconductor layer 42, the gate insulating layer 62, and the gate electrode 73 are covered with the interlayer insulating layer 10. The interlayer insulating layer 10 may be in contact with a part of the upper surface of the second region b2 of the oxide semiconductor layer 42.

The source electrode 83 and the drain electrode 84 are formed in the third metal layer M3. In this example, an opening 93 that exposes the source contact region 42s of the oxide semiconductor layer 42 and an opening 94 that exposes a part of the drain contact region 42d are provided in the interlayer insulating layer 10. The source electrode 83 is disposed on the interlayer insulating layer 10 and in the opening 93, and is connected to the source contact region 42s in the opening 93. The drain electrode 84 is disposed on the interlayer insulating layer 10 and in the opening 94, and is connected to the drain contact region 42d in the opening 94.

The second TFT 200 may include a lower conductive layer 22 that functions as a light blocking layer on the substrate 1 side of the oxide semiconductor layer 42. The lower conductive layer 22 is formed in the same first metal layer M1 as the gate electrode 21 of the first TFT 100. The lower conductive layer 22 is covered with the lower insulating layer 3. The oxide semiconductor layer 42 is disposed on the lower insulating layer 3. The lower conductive layer 22 may be disposed to overlap with at least the channel region 42c of the oxide semiconductor layer 42 when viewed from the normal direction of the substrate 1. In this manner, deterioration of characteristics of the oxide semiconductor layer 42 caused by light (light of a backlight) from the substrate 1 side can be suppressed.

The lower conductive layer 22 may be electrically in a floating state or may be fixed to the GND potential (0 V). Alternatively, the lower conductive layer 22 may function as a lower gate electrode by being electrically connected to the gate electrode 73 by a connection section (not illustrated, hereinafter a "gate connection section") (double gate structure). As a result, the ON-current of the second TFT 200 can be further increased.

In the present embodiment, the first insulating film L1 serving as the gate insulating layer 62 of the second TFT 200 is used to form the channel protection layer 61 of the first TFT 100. The channel protection layer 61 can function as an etch stop layer that reduces an etching damage of the oxide semiconductor layer 41 in an etching step (in this example, a source-drain separation step) of the second metal layer M2. In addition, in the step of processing for lowering the resistance (for example, plasma processing) for forming a low-resistive region in the oxide semiconductor layer 42 of the second TFT 200, the channel protection layer 61 functions as a mask for suppressing the channel region 41c of the oxide semiconductor layer 41 from being low-resistive. This makes it possible to suppress reduction in TFT characteristics of the first TFT 100 due to the step of processing for lowering the resistance of the second TFT 200. Furthermore, for example, even in a case where the interlayer insulating layer 10 is a reducing insulating film (e.g., an SiN film) that can reduce an oxide semiconductor, by the channel protection layer (e.g., an oxide film such as an SiO2 film) 61 interposed between the interlayer insulating layer 10 and at least the channel region 41c of the oxide semiconductor layer 41, the channel region 41c can be suppressed from being low-resistive by the interlayer insulating layer 10.

TFT Characteristics

According to the present embodiment, the first TFT 100 having a bottom gate structure and the second TFT 200 having a top gate or double gate structure that have different characteristics from each other can be separately manufactured while using a common oxide semiconductor film (here, the layered oxide semiconductor film OS including the low mobility oxide semiconductor film S1 and the high mobility oxide semiconductor film S2).

In the first TFT 100 having a bottom gate structure, the low mobility oxide semiconductor film S1 located on the lower insulating layer 3 side, which is the gate insulating layer, contributes as a channel more greatly than the high mobility oxide semiconductor film S2. In other words, the channel of the first TFT 100 can be formed mainly in the low mobility oxide semiconductor film S1. On the other hand, in the second TFT 200 having a top gate structure, the high mobility oxide semiconductor film S2 located on the gate insulating layer 62 side contributes as a channel greatly. In other words, the channel of the second TFT 200 can be formed mainly in the high mobility oxide semiconductor film S2. This makes the mobility (TFT mobility) as the TFT of the second TFT 200 higher than that of the first TFT 100. In other words, the second TFT 200 can have a higher current driving force. In addition, the Vg-Id characteristic of the first TFT 100 is relatively gentle, and the Vg-Id characteristic of the second TFT 200 is steeper than that of the first TFT 100.

A thickness t1 of the lower insulating layer 3 serving as the gate insulating layer of the first TFT 100 may be greater than a thickness t2 of the gate insulating layer 62 of the second TFT 200. This allows the Vg-Id characteristic of the first TFT 100 to be further laid, and the Vg-Id characteristics of the second TFT 200 to be further raised. For example, when both the lower insulating layer 3 and the gate insulating layer 62 are an $SiO_2$ film, the thickness t1 of the lower insulating layer 3 may be 200 nm or more and 450 nm or less (for example, about 300 nm), and the thickness t2 of the gate insulating layer 62 may be from 100 nm or more and 200 nm or less.

Figure 2:
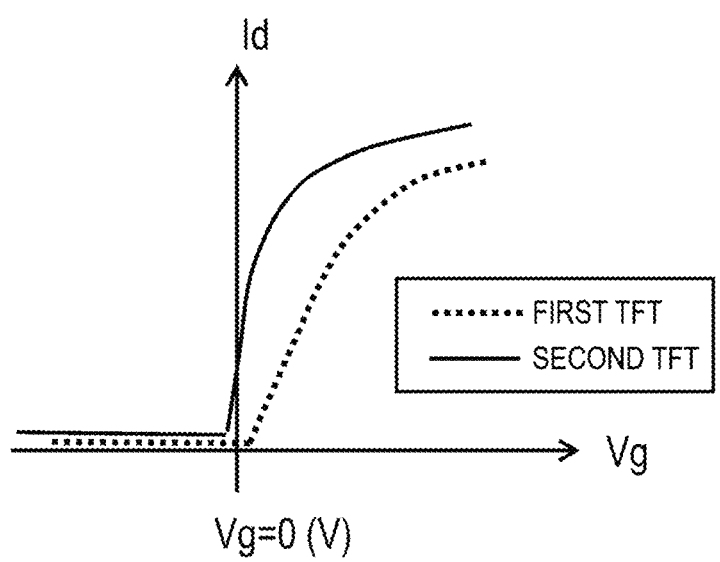
FIG. 2 is a diagram showing Vg-Id characteristics of the first TFT 100 and the second TFT 200.

FIG. 2 is a diagram exemplifying the Vg-Id characteristics of the first TFT 100 and the second TFT 200. The horizontal axis of the graph represents the potential of a gate electrode based on the potential of the drain electrode (gate-drain voltage) Vg, and the vertical axis of the graph represents a drain current Id. The second TFT 200 has a higher TFT mobility than the first TFT 100, and thus the threshold voltage of the second TFT 200 is shifted in a negative direction with respect to that of the first TFT 100. Further, the Vg-Id characteristic of the first TFT 100 is gentler than that of the second TFT 200. That is, the S value of the first TFT 100 is smaller than that of the second TFT 200. Note that the positive/negative and magnitude of the threshold voltage and the slope of the Vg-Id characteristic of each TFT, and the like are not limited to the shown examples.

The first TFT 100 has a large S value, and thus the first TFT 100 is suitably used as the drive pixel TFT of the pixel circuit provided in each pixel in the active matrix substrate used in the organic EL display device. As a result, the multi-gray scale display can be suitably performed. In addition, as illustrated, in a case where the first TFT 100 has the enhancement characteristics, the first TFT 100 can be suitably used for some TFTs constituting peripheral circuits such as a drive circuit. As a result, circuit malfunction can be suppressed, thereby reducing yield loss.

On the other hand, the second TFT 200 has a large current driving force (ON-current) and a high switching speed. The second TFT 200 is suitably used as the selection pixel TFT in a pixel circuit, for example. As a result, the second TFT 200 can be applied to high frequency or high definition models. The second TFT 200 may also be used as some TFTs used in peripheral circuits, for example, a TFT for a demultiplexer circuit, or an output transistor of a gate drive circuit.

MODIFIED EXAMPLE

The TFT structures of the first TFT 100 and the second TFT 200 are not limited to the structures illustrated in FIGS. 1A and 1B. A modified example of the TFT structure according to the present embodiment will be described below. In the following description, the same structure as in FIGS. 1A and 1B will be omitted as appropriate.

Figure 3A:
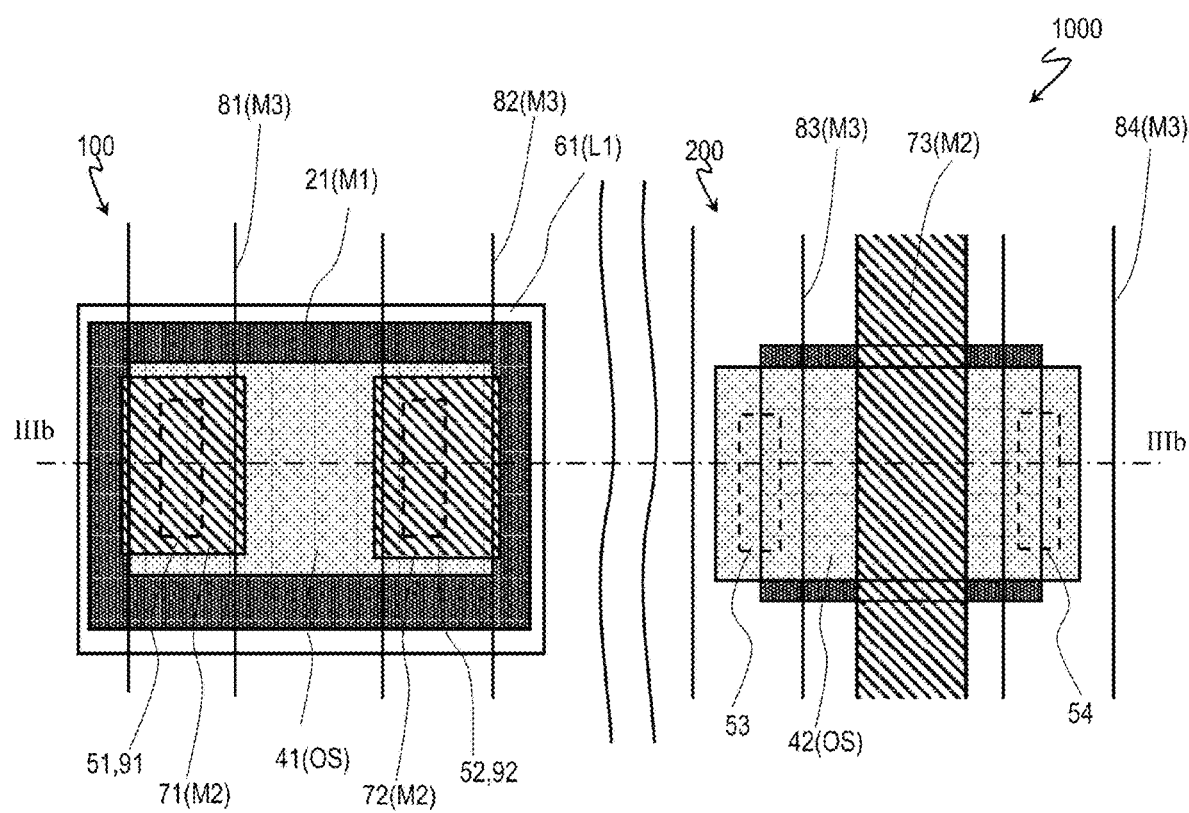
FIG. 3A is a plan view illustrating another example of the first TFT 100 and the second TFT 200 in the active matrix substrate.
Figure 3B:
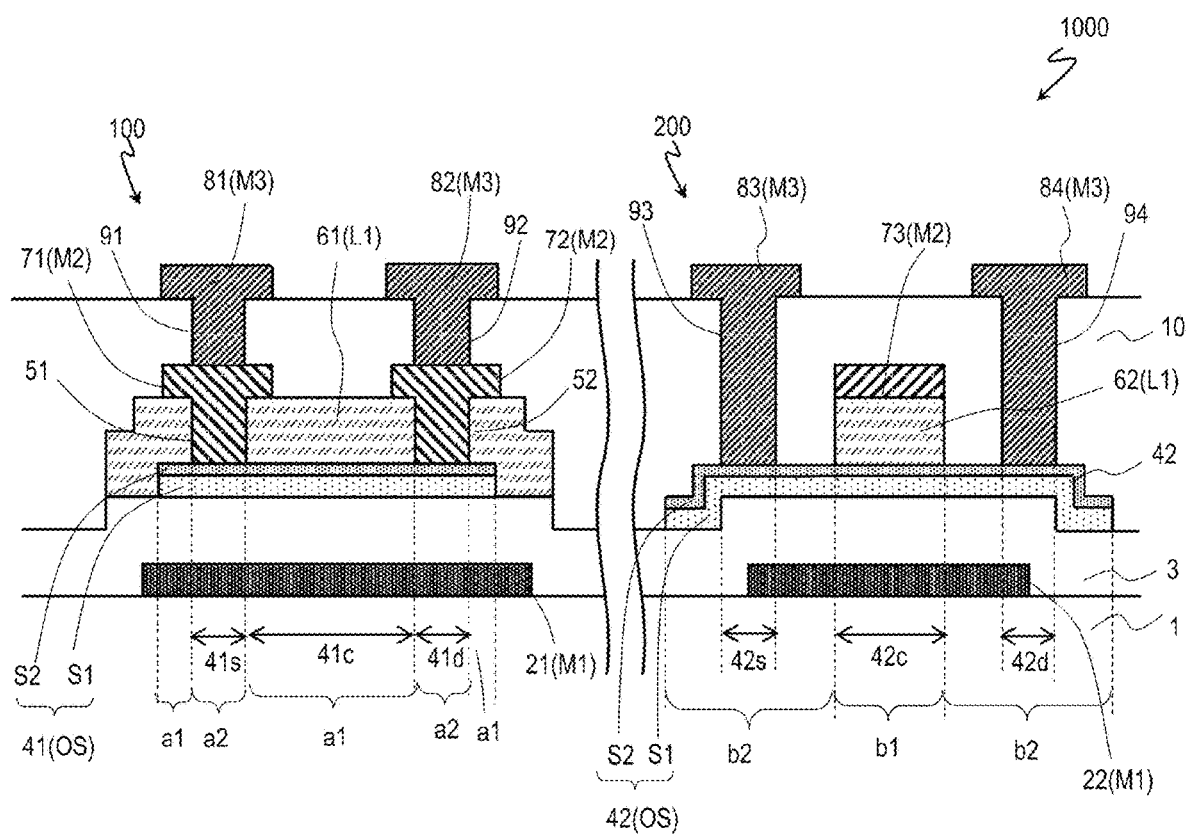
FIG. 3B is a cross-sectional view taken along a line IIIb-IIIb illustrated in FIG. 3A.

FIG. 3A and FIG. 3B are a plan view and a cross-sectional view, respectively, illustrating another example of the first TFT 100 and the second TFT 200. As illustrated, an upper source electrode 81 electrically connected to the source electrode 71 and an upper drain electrode 82 electrically connected to the drain electrode 72 may be formed in the third metal layer M3. In this example, the interlayer insulating layer 10 includes an opening 91 that exposes a part of the source electrode 71 (or a wiring line including the source electrode 71), and an opening 92 that exposes a part of the drain electrode 72 (or a wiring line including the drain electrode 72). The upper source electrode 81 is disposed on the interlayer insulating layer 10 and in the opening 91, and is electrically connected to the source electrode 71 in the opening 91. The upper drain electrode 82 is disposed on the interlayer insulating layer 10 and in the opening 92, and is electrically connected to the drain electrode 72 in the opening 92. When viewed from the normal direction of the substrate 1, the openings 91, 92 may at least partially overlap with the openings 51, 52 formed in the channel protection layer 61, or does not need to overlap with the openings 51, 52. For example, the source electrode 71 and the drain electrode 72 may be extended to a region that does not overlap with the oxide semiconductor layer 41 when viewed from the normal direction of the substrate 1, and the extending portion of the source electrode 71 and the extending portion of the drain electrode 72 may be connected to the upper source electrode 81 and the upper drain electrode 82 in the openings 91, 92 provided in the interlayer insulating layer 10, respectively.

Figure 4:
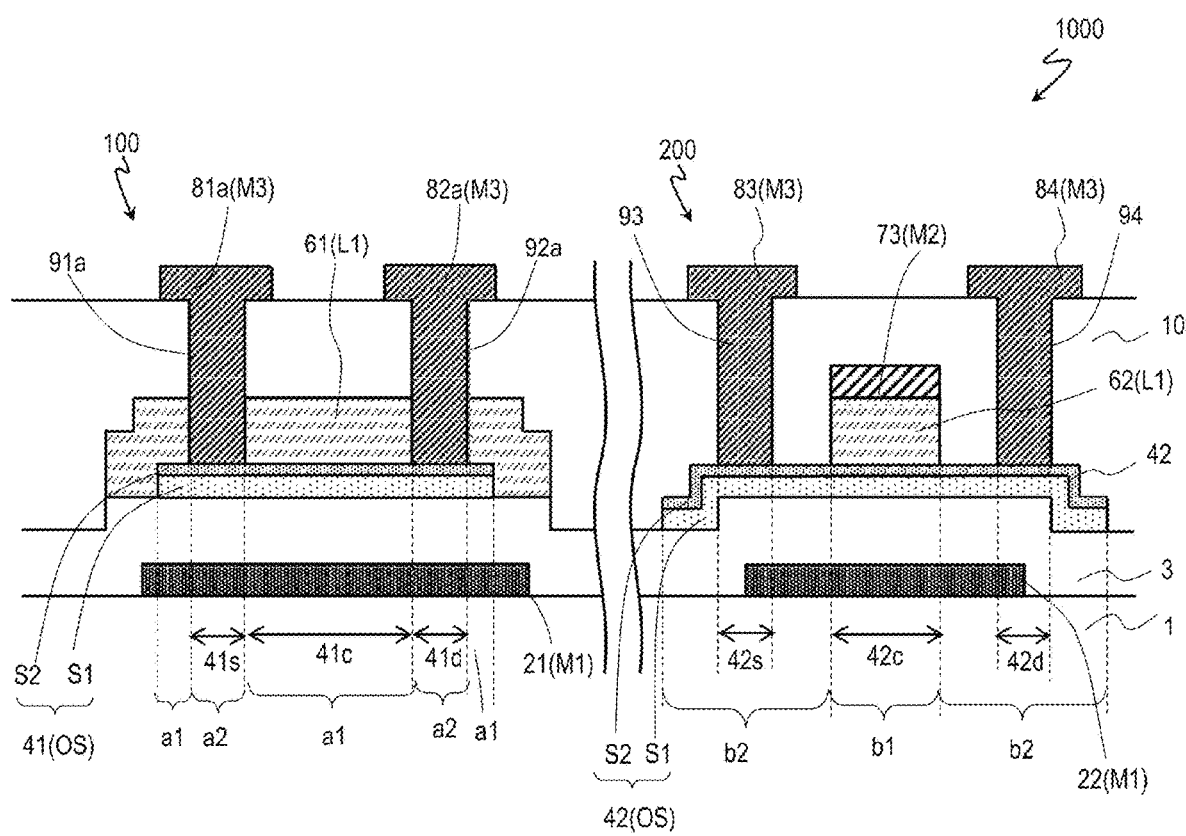
FIG. 4 is a plan view illustrating yet another example of the first TFT 100 and the second TFT 200.

FIG. 4 is a cross-sectional view illustrating yet another example of the first TFT 100. In the example illustrated in FIG. 4, a source electrode 81a and a drain electrode 82a are formed in the third metal layer M3. Openings 91a, 92a that expose the source contact region 41s and the drain contact region 41d of the oxide semiconductor layer 41, respectively, are formed in the interlayer insulating layer 10. The source electrode 81a is electrically connected to the source contact region 41s of the oxide semiconductor layer 41 in the opening 91a formed in the interlayer insulating layer 10. The drain electrode 82a is electrically connected to the drain contact region 41d of the oxide semiconductor layer 41 in the opening 92a formed in the interlayer insulating layer 10.

In this manner, in the present embodiment, the source electrode and the drain electrode of the first TFT 100 can be formed in any of the second metal layer M2, the third metal layer M3, and the other metal layer (e.g., a transparent conductive layer including a pixel electrode) in consideration of the configuration and layout of the circuit. This makes it possible to more easily connect the first TFT 100 to other elements and wiring lines in the circuit, and to reduce the circuit area. Although not illustrated, only one of the source electrode and the drain electrode may be formed in the second metal layer M2, or only one of the source electrode and the drain electrode may be formed in the third metal layer M3. For example, one of the source electrode and the drain electrode may be formed in the second metal layer M2, and the other may be formed in the third metal layer M3.

In the example illustrated in FIGS. 1A and 1B, when viewed from the normal direction of the substrate 1, the channel protection layer 61 and the gate insulating layer 62 have island-shaped patterns separated from each other, but the channel protection layer 61 and the gate insulating layer 62 may be connected to each other. In other words, the channel protection layer 61 and the gate insulating layer 62 may be a part of a continuous film formed of the first insulating film L1.

Figure 5A:
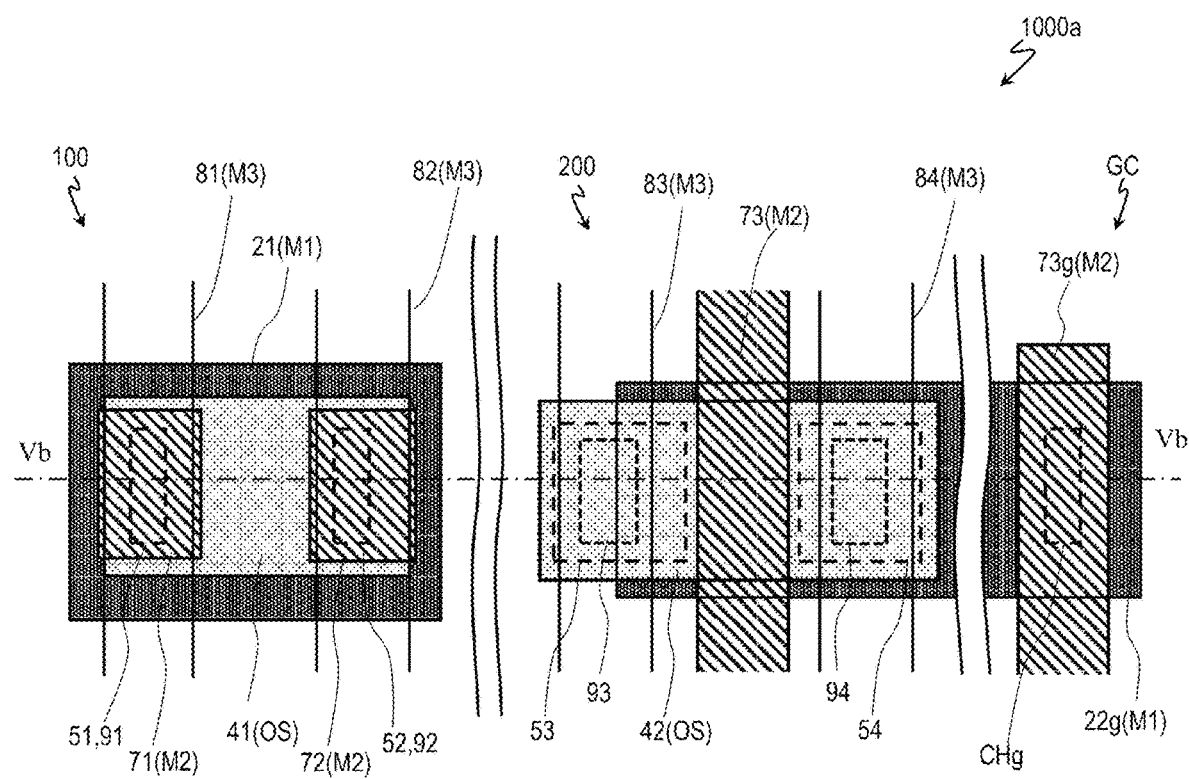
FIG. 5A is a plan view illustrating yet another example of the first TFT 100 and the second TFT 200.
Figure 5B:
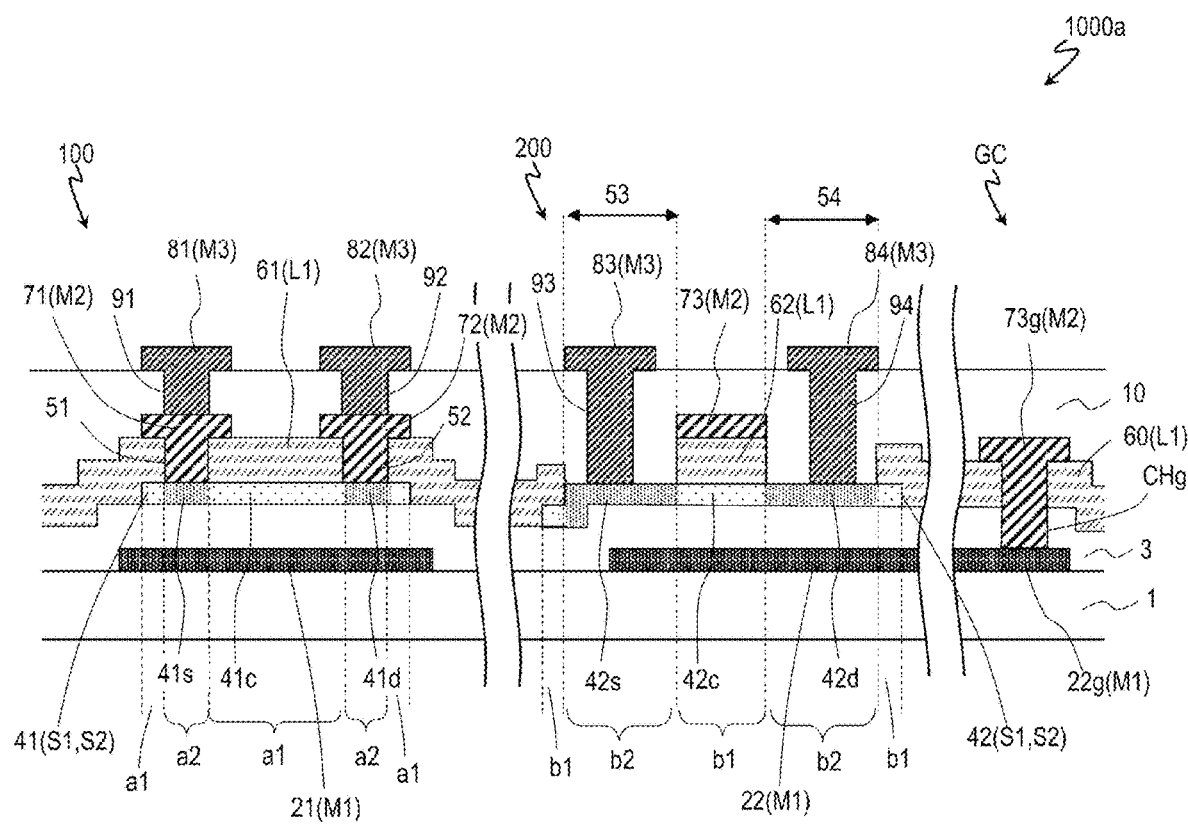
FIG. 5B is a cross-sectional view taken along a line Vb-Vb illustrated in FIG. 5A.

FIGS. 5A and 5B are a plan view and a cross-sectional view, respectively, illustrating another example of the active matrix substrate. As illustrated, an active matrix substrate 1000a includes a continuous insulating layer 60 formed of the first insulating film L1 and including the channel protection layer 61 and the gate insulating layer 62. In the first TFT 100, the insulating layer 60 has the openings 51, 52 that expose the source contact region 41s and the drain contact region 41d of the oxide semiconductor layer 41, respectively. Further, in the second TFT 200, the insulating layer 60 has openings 53, 54 that expose a part of the oxide semiconductor layer 42. Each of regions (second region) b2 of the oxide semiconductor layer 42, which are exposed by the openings 53, 54, is a low-resistive region having a specific resistance lower than a region (first region) b1 covered with the insulating layer 60. The openings 93, 94 of the interlayer insulating layer 10 may be located inside the openings 53, 54, respectively, when viewed from the normal direction of the substrate 1. This makes it possible to form the source contact region 42s and the drain contact region 42d in the second region b2 which is the low-resistive region, and thus reducing a contact resistance between the oxide semiconductor layer 42, and the source electrode 83 and the drain electrode 84.

In a case where the active matrix substrate 1000a includes a plurality of first TFTs 100 and a plurality of second TFTs 200, a plurality of channel protection layers 61 and a plurality of gate insulating layers 62 may be connected to each other. In this manner, for example, when the interlayer insulating layer 10 is formed, a step caused by the first insulating film L1 is reduced, and thus, for example, coverage of a portion of the interlayer insulating layer 10 located near the source electrode 71 and the drain electrode 72 of the first TFT 100 can be improved. On the other hand, in a case where the channel protection layer 61 and the gate insulating layer 62 are disposed away from each other, as illustrated in FIGS. 1A and 1B, for example, coverage of a portion of the interlayer insulating layer 10 located near the source electrode 83 and the drain electrode 84 of the second TFT 200 can be improved.

In addition, as illustrated in FIGS. 5A and 5B, the active matrix substrate 1000a may further include a gate connection section GC that electrically connects the lower conductive layer 22 of the second TFT 200 to the gate electrode 73. In this example, an upper connection section 73g extended from the gate electrode 73 and a lower connection section 22g extended from the lower conductive layer 22 are electrically connected to each other in a contact hole CHg provided in the lower insulating layer 3 and the first insulating film L1. By electrically connecting the gate electrode 73 and the lower conductive layer 22, the second TFT 200 having a double gate structure is obtained. In the second TFT 200 having a double gate structure, the lower conductive layer 22 functions as a "lower gate electrode" of the second TFT 200", and the lower insulating layer 3 functions as a "lower gate insulating layer" of the second TFT 200. In this case, the gate electrode 73 of the second TFT 200 is sometimes referred to as an "upper gate electrode", and the gate insulating layer 62 is sometimes referred to as an "upper gate insulating layer".

Although not illustrated, the active matrix substrate 1000 illustrated in FIGS. 1A and 1B may also have the gate connection section GC. In the active matrix substrate 1000, the first insulating film L1 does not need to be present in a region where the gate connection section is formed. In this case, in the gate connection section GC, the upper connection section 73g in the second metal layer M2 and the lower connection section 22g in the first metal layer M1 may be connected to each other via an opening formed in the lower insulating layer 3.

Low Mobility Oxide Semiconductor Film S1 and High Mobility Oxide Semiconductor Film S2

The composition, thickness, crystal structure, forming method, and the like of each of oxide semiconductor films are not particularly limited. Each of the high mobility oxide semiconductor film S2 and the low mobility oxide semiconductor film S1 may be a single-layer film or a layered film including a plurality of oxide semiconductor films. The mobility of the high mobility oxide semiconductor film S2 (when the high mobility oxide semiconductor film S2 is a layered film, the mobility of the entire layered film) only needs to be higher than the mobility of the low mobility oxide semiconductor film S1.

The high mobility oxide semiconductor film S2 and the low mobility oxide semiconductor film S1 may have different compositions. "Having different compositions" means that each of the layers contains different types of metal elements or metal elements with different composition ratios. As an example, each of the high mobility oxide semiconductor film S2 and the low mobility oxide semiconductor film S1 may include In and/or Sn, and a sum of atomic ratios of In and Sn to all metal elements in the high mobility oxide semiconductor film S2 may be greater than a sum of atomic ratios of In and Sn to all metal elements in the low mobility oxide semiconductor film S1.

For example, each of the high mobility oxide semiconductor film S2 and the low mobility oxide semiconductor film S1 may be an In—Ga—Zn—O based oxide semiconductor layer, and an atomic ratio of In in the low mobility oxide semiconductor film S1 may be less than an atomic ratio of In in the high mobility oxide semiconductor film S2. Alternatively, an atomic ratio of Ga in the low mobility oxide semiconductor film S1 may be greater than an atomic ratio of Ga in the high mobility oxide semiconductor film S2.

Further, the high mobility oxide semiconductor film S2 may contain Sn, and the low mobility oxide semiconductor film S1 does not need to contain Sn. Instead, the low mobility oxide semiconductor film S1 may contain Sn at a lower concentration than a concentration of Sn in the high mobility oxide semiconductor film S2. In other words, an atomic ratio of Sn to all metal elements in the low mobility oxide semiconductor film S1 may be less than an atomic ratio of Sn to all metal elements in the high mobility oxide semiconductor film S2.

As the low mobility oxide semiconductor film S1, for example, an In—Ga—Zn—O based semiconductor film (e.g., In:Ga:Zn=1:1:1) can be used. As the high mobility oxide semiconductor film S2, for example, an In—Ga—Zn—O based semiconductor film (for example, In:Ga:Zn=5:1:4), an In—Sn—Zn—O based semiconductor film, an In—Al—Sn—Zn—O based semiconductor film, an In—W—Zn—O based semiconductor film, an In—Sn—O based semiconductor film, an In—Zn—O based semiconductor film, an In—Ga—Sn—O based semiconductor film, an In—Sn—Ti—Zn—O based semiconductor film, or the like can be used.

Further, the low mobility oxide semiconductor film S1 and the high mobility oxide semiconductor film S2 may have different crystal structures from each other. For example, one of the low mobility oxide semiconductor film and the high mobility oxide semiconductor film may be an amorphous oxide semiconductor film, and the other may be a crystalline oxide semiconductor film containing a crystalline portion.

Further, even when the ratio of each metal element of the low mobility oxide semiconductor film and the ratio of each metal element of the high mobility oxide semiconductor film are the same, the mobilities of these oxide semiconductor films can be made different from each other by changing the film formation method or the film formation conditions. For example, the atmosphere in the chamber (for example, the flow ratio of oxygen to argon supplied to the chamber) when forming an oxide semiconductor film by sputtering may be different between the low mobility oxide semiconductor film and the high mobility oxide semiconductor film. Specifically, when forming the low mobility oxide semiconductor film S1, a flow ratio of oxygen to argon may be set great (for example, 80%), and when forming the high mobility oxide semiconductor film S2, the flow ratio of oxygen to argon may be set less than when forming the low mobility oxide semiconductor film S1 (for example, 20%).

The thicknesses of the low mobility oxide semiconductor film S1 and the high mobility oxide semiconductor film S2 may be substantially the same or different. The high mobility oxide semiconductor film S2 may be thinner than the low mobility oxide semiconductor film S1. The thickness of the high mobility oxide semiconductor film S2 may be 3 nm or more and 15 nm or less, for example. The thickness of the low mobility oxide semiconductor film S1 may be 10 nm or more and 40 nm or less, for example.

Manufacturing Method of Active Matrix Substrate

A method for manufacturing an active matrix substrate according to the present embodiment will be described below by using the active matrix substrate 1000a illustrated in FIGS. 5A and 5B as an example. FIGS. 6A to 6G are process cross-sectional views for explaining the method for manufacturing the active matrix substrate 1000a. In each of the process cross-sectional views, a TFT formation region R1 in which the first TFT 100 is formed, a TFT formation region R2 in which the second TFT 200 is formed, and a connection section formation region Rg in which the gate connection section GC is formed are illustrated in this order from the left side. Although one first TFT 100, one second TFT 200, and one gate connection section GC are illustrated in these cross-sectional views for simplicity, a plurality of first TFTs 100, a plurality of second TFTs 200, and a plurality of gate connection sections GC can be formed in the active matrix substrate 1000. Note that the various structures described above with reference to FIGS. 1A, 1B, 3A, 3B, and 4 can be also manufactured by the same method as that described below by changing patterns of the first insulating film L1, the second metal layer M2, the third metal layer M3, and the like.

Figure 6A:
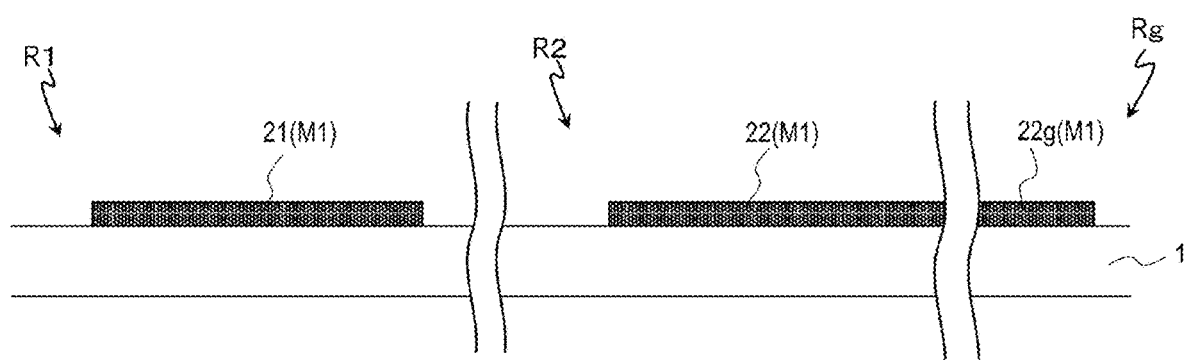
FIG. 6A is a process cross-sectional view illustrating a manufacturing method of the active matrix substrate.

STEP 1: Formation of First Metal Layer M1 (FIG. 6A)

A first conductive film (having a thickness equal to or larger than 50 nm and equal to or less than 500 nm) is formed on the substrate 1 by a sputtering method, for example. Next, the first conductive film is patterned by a known photolithography process. In this manner, as illustrated in FIG. 6A, the gate electrode 21 is formed in the TFT formation region R1, the lower conductive layer 22 is formed in the TFT formation region R2, and the lower connection section 22g is formed in the connection section formation region Rg. The lower connection section 22g is electrically connected to the lower conductive layer 22. In this example, the lower connection section 22g is an extending portion of the lower conductive layer 22.

As the substrate 1, a transparent substrate with insulating properties, for example, a glass substrate, a silicon substrate, a heat-resistant plastic substrate (resin substrate), or the like can be used.

The material of the first conductive film is not limited, and a film containing metal such as aluminum (Al), tungsten (W), molybdenum (Mo), tantalum (Ta), chromium (Cr), titanium (Ti), copper (Cu) or the like, an alloy thereof, or metal nitride thereof can be appropriately used. Further, a layered film obtained by layering such a plurality of films may be used.

Here, a single-layer film of a metal film (or an alloy film) containing Cu or Al is used as the first conductive film. Alternatively, a layered film having a metal film containing Cu or Al as a top layer may be used.

STEP 2: Formation of Lower Insulating Layer 3 (FIG. 6B)

Figure 6B:
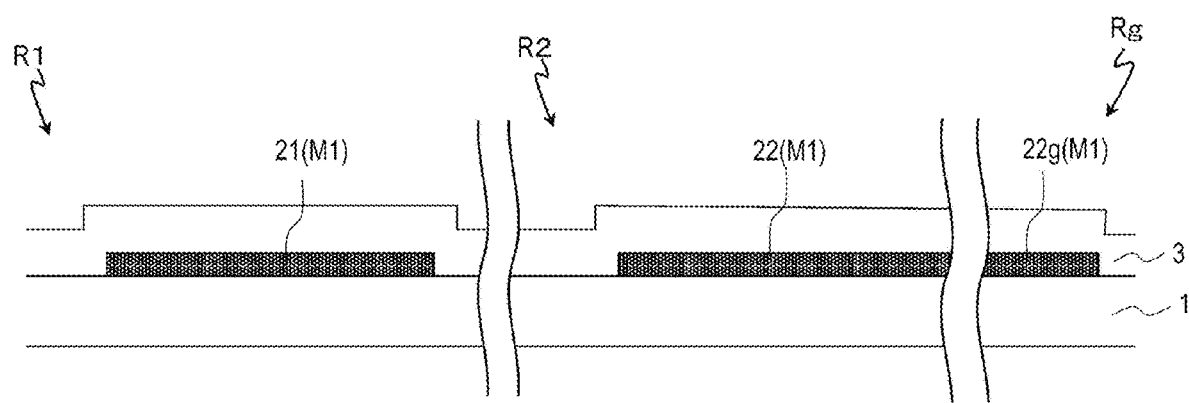
FIG. 6B is a process cross-sectional view illustrating the manufacturing method of the active matrix substrate.

Subsequently, as illustrated in FIG. 6B, the lower insulating layer (having a thickness of, for example, 300 nm) 3 is formed so as to cover the gate electrode 21 and the lower conductive layer 22.

The lower insulating layer 3 is formed by CVD, for example. As the lower insulating layer 3, a silicon oxide (SiOx) layer, a silicon nitride (SiNx) layer, a silicon oxynitride (SiOxNy; x>y) layer, a silicon nitride oxide (SiNxOy; x>y) layer, or the like may be used as appropriate. The lower insulating layer 3 may be a single-layer or may include a layered structure. For example, a silicon nitride (SiNx) layer, a silicon nitride oxide layer, or the like may be formed on a substrate side (as a lower layer) in order to prevent diffusion of impurities and the like from the substrate 1, and a silicon oxide ($SiO_2$) layer, a silicon oxynitride layer, or the like may be formed on the top of the lower layer (as an upper layer) in order to ensure insulating properties.

In the present embodiment, the lower insulating layer 3 also functions as the gate insulating layer of the first TFT and the lower gate insulating layer of the second TFT. From this perspective, the thickness of the lower insulating layer 3 is preferably thicker than that of the first insulating film L1 serving as the upper gate insulating layer of the second TFT. In a case where the lower insulating layer 3 is a silicon oxide layer, the thickness of the lower insulating layer 3 may be, for example, 200 nm or more and 450 nm or less. As a result, in the first TFT, the Vg-Id characteristic of the first TFT can be further laid while ensuring a desired ON-current. On the other hand, the ON-current of the second TFT 200 can be further increased.

Figure 6C:
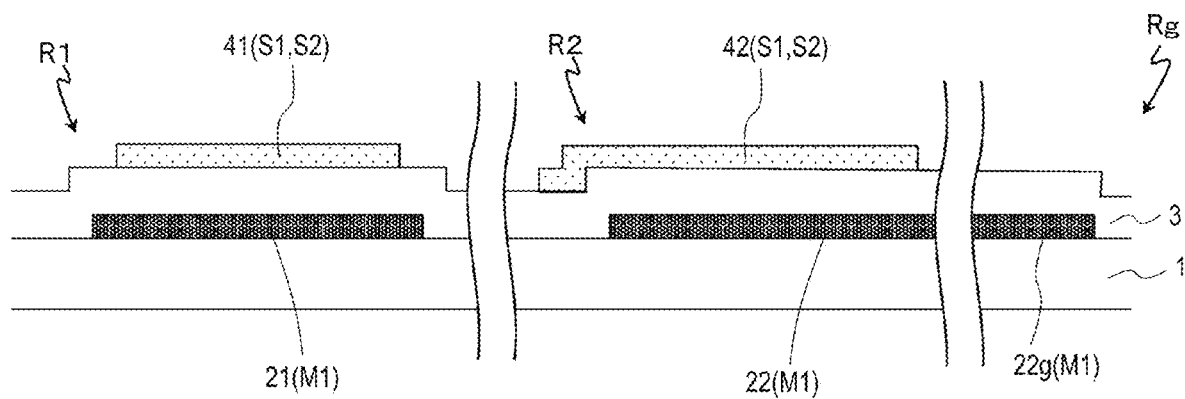
FIG. 6C is a process cross-sectional view illustrating the manufacturing method of the active matrix substrate.

STEP 3: Formation of Oxide Semiconductor Layers 41, 42 (FIG. 6C)

Next, the low mobility oxide semiconductor film S1 and the high mobility oxide semiconductor film S2 are formed in this order on the lower insulating layer 3 to obtain a layered oxide semiconductor film.

The low mobility oxide semiconductor film S1 and the high mobility oxide semiconductor film S2 may be formed by sputtering, for example. Here, as the low mobility oxide semiconductor film S1, an In—Ga—Zn—O based semiconductor film (for example, In:Ga:Zn=1:1:1) having a thickness of 30 nm is formed. As the high mobility oxide semiconductor film S2, an In—Ga—Zn—O based semiconductor film (for example, In:Ga:Zn=5:1:4) having a thickness of 7 nm is formed.

Subsequently, the layered oxide semiconductor film is patterned. In this manner, as illustrated in FIG. 6C, the oxide semiconductor layer 41 serving as the active layer of the first TFT is formed in the TFT formation region R1, and the oxide semiconductor layer 42 serving as the active layer of the second TFT is formed in the TFT formation region R2. The patterning of the layered oxide semiconductor film may be performed by dry etching or wet etching. In a case of wet etching, a PAN-based etching solution or an oxalic acid-based etching solution can be used when both the low mobility oxide semiconductor film S1 and the high mobility oxide semiconductor film S2 are In—Ga—Zn—O based semiconductor films. An oxalic acid-based etching solution can be used when the low mobility oxide semiconductor film S1 is an In—Ga—Zn—O based semiconductor film and the high mobility oxide semiconductor film S2 is an In—Sn—Zn—O based semiconductor film. The low mobility oxide semiconductor film S1 and the high mobility oxide semiconductor film S2 may be annealed before or after patterning the layered oxide semiconductor film.

Although an example in which the low mobility oxide semiconductor film S1 and the high mobility oxide semiconductor film S2 are simultaneously (collectively) patterned is described here, the low mobility oxide semiconductor film S1 and the high mobility oxide semiconductor film S2 may be patterned separately. For example, after forming the oxide semiconductor layer 41 by patterning the low mobility oxide semiconductor film S1, formation and patterning of the high mobility oxide semiconductor film S2 may be performed.

STEP 4: Formation of First Insulating Film L1 (FIG. 6D)

Figure 6D:
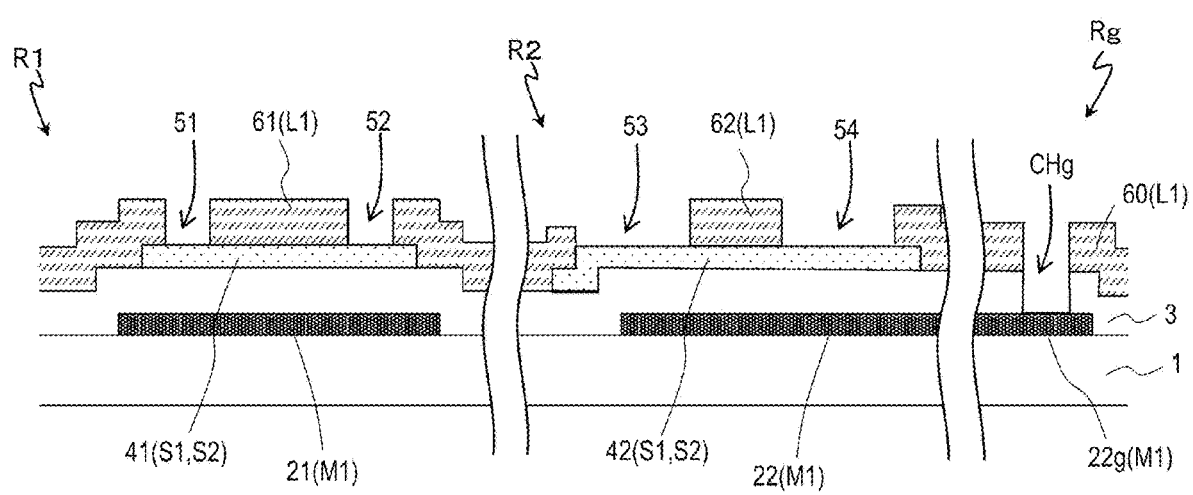
FIG. 6D is a process cross-sectional view illustrating the manufacturing method of the active matrix substrate.

Next, as illustrated in FIG. 6D, the first insulating film L1 is formed on the lower insulating layer 3, the oxide semiconductor layer 41, and the oxide semiconductor layer 42, and the first insulating film L1 is patterned to form the insulating layer 60 including (portions functioning as) the channel protection layer 61 and the gate insulating layer 62. In this example, the patterning of the first insulating film L1 forms the openings 51, 52 that expose a part of the oxide semiconductor layer 41 in the TFT formation region R1, and forms the openings 53, 54 that expose a part of the oxide semiconductor layer 42 in the TFT formation region R2. In addition, in the connection section formation region Rg, the first insulating film L1 and the lower insulating layer 3 are etched simultaneously to form the contact hole CHg that exposes a part of the lower connection section 22g.

Note that, as illustrated in FIGS. 1A and 1B, the channel protection layer 61 and the gate insulating layer 62 separated from each other may be formed by the patterning of the first insulating film L1. In this case, the channel protection layer 61 has the openings 51, 52, and has an island-shaped pattern covering the oxide semiconductor layer 41. The channel protection layer 61 may also cover a portion of the lower insulating layer 3 located near an edge of the oxide semiconductor layer 41. The gate insulating layer 62 has an island-shaped pattern located on a part of the oxide semiconductor layer 42, for example.

As the first insulating film L1, for example, an insulating film similar to the lower insulating layer 3 (insulating film exemplified as the lower insulating layer 3) can be used. Here, a silicon oxide ($SiO_2$) film is formed as the first insulating film L1. In a case where an oxide film such as a silicon oxide film is used as the gate insulating film, oxidation defects generated in the channel regions of the oxide semiconductor layers 41, 42 can be reduced by the oxide film, and thus, the channel region being low-resistive can be suppressed.

The thickness of the first insulating film L1 may be, for example, 100 nm or more and 200 nm or less. If the thickness of the first insulating film L1 is 100 nm or more, a portion of the oxide semiconductor layer 41 of the first TFT, which serves as the channel region, can more effectively be suppressed from being reduced to be low-resistive by the interlayer insulating layer 10. In addition, in the step of processing for lowering the resistance (described below), which causes the oxide semiconductor layer 42 to be partially low-resistive, a portion of the oxide semiconductor layer 41 of the first TFT (including a portion serving as the channel region), which is covered with the first insulating film L1, can be suppressed from being low-resistive. On the other hand, if the thickness of the first insulating film L1 is 150 nm or less, the gate insulating layer 62 of the second TFT can be made thinner, and thus the Vg-Id characteristic of the second TFT can be further raised, and a high ON-characteristic (TFT mobility) can be achieved.

Figure 6E:
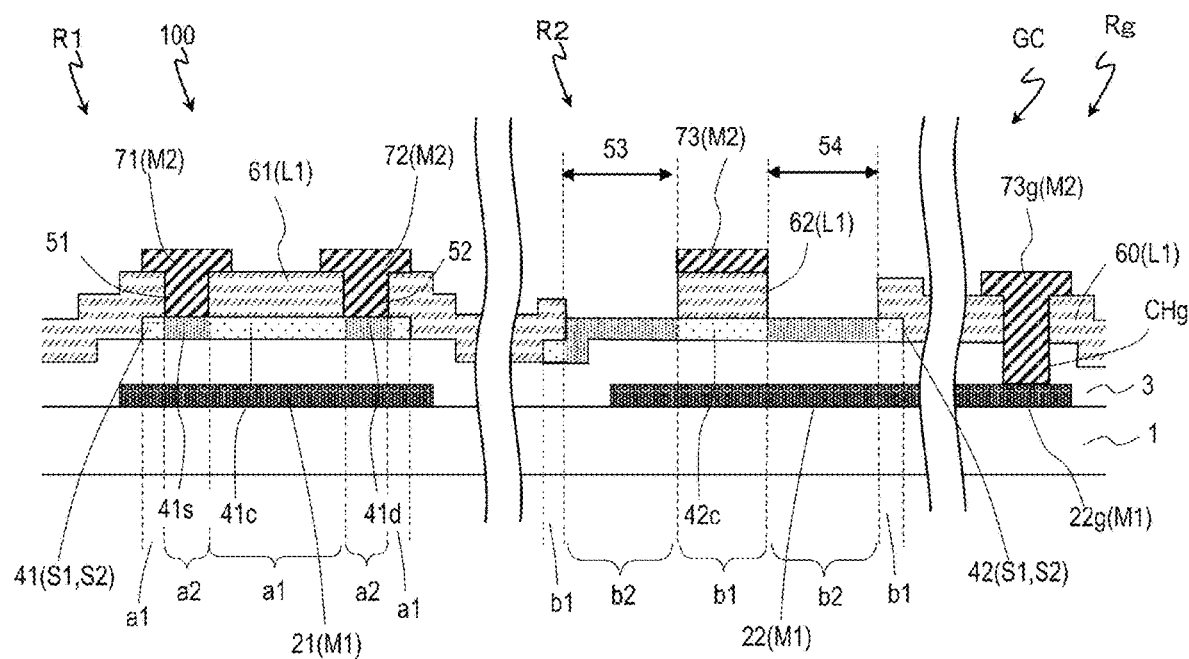
FIG. 6E is a process cross-sectional view illustrating the manufacturing method of the active matrix substrate.

STEP 5: Formation of Second Metal Layer M2 (FIG. 6E)

A second conductive film (having a thickness of, for example, 50 nm or more and 500 nm or less) is formed on the first insulating film L1, and the second conductive film is patterned. As a result, as illustrated in FIG. 6E, the source electrode 71 and the drain electrode 72 are formed in the TFT formation region R1, and the gate electrode 73 is formed in the TFT formation region R2. In this manner, the first TFT 100 is obtained in the TFT formation region R1.

The source electrode 71 and the drain electrode 72 are in contact with exposed portions of the oxide semiconductor layer 41 (the source contact region 41s and the drain contact region 41d) in the openings 51, 52, respectively. The source contact region 41s and the drain contact region 41d are in contact with the source electrode 71 and the drain electrode 72 that are formed of, for example, a metal film, thereby forming low resistance regions (second regions) a2 each having a lower specific resistance than specific resistances of the other portions (first regions) a1 of the oxide semiconductor layer 41.

Figure 14:
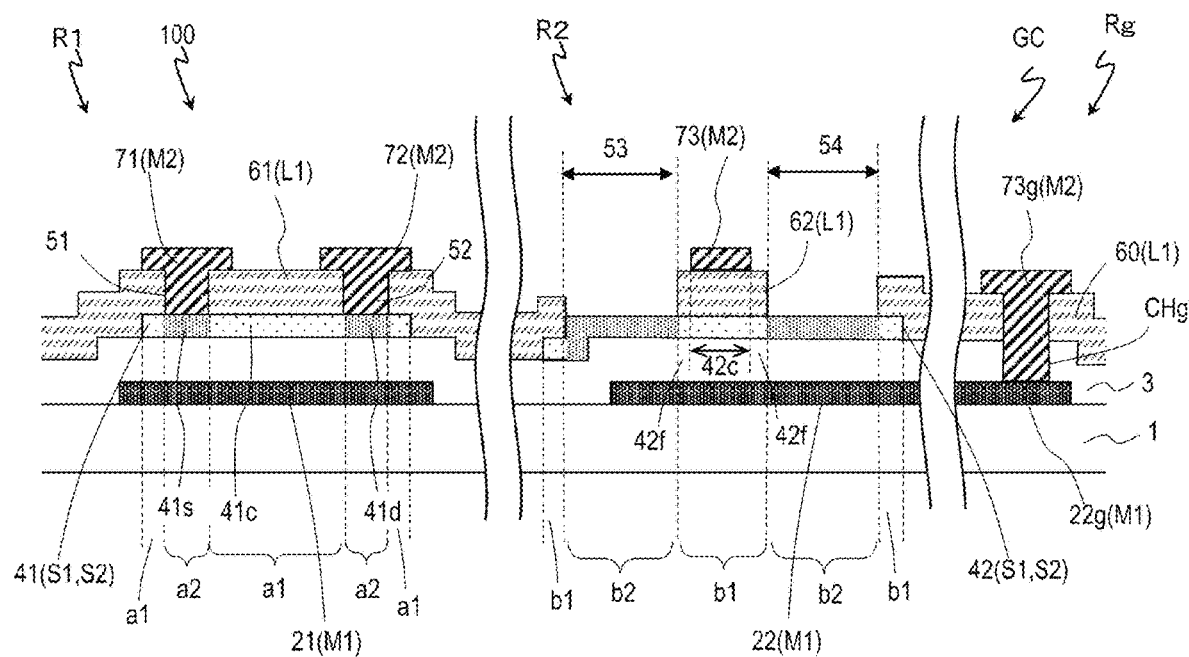
FIG. 14 is a process cross-sectional view illustrating yet another manufacturing method of the active matrix substrate.

The gate electrode 73 is formed on the gate insulating layer 62, for example. In FIG. 6E, edges (side surfaces) of the gate electrode 73 and the gate insulating layer 62 are aligned in a cross section of the second TFT 200 in the channel length direction, but as illustrated in FIG. 14, the edge of the gate electrode 73 may be located inside the edge of the gate insulating layer 62 in a cross section that crosses the oxide semiconductor layer 42 of the second TFT 200 in the channel length direction. In this case, a portion of the oxide semiconductor layer 42, which overlaps with the gate electrode 73, serves as the channel region 42c, when viewed from the normal direction of the substrate 1. On both sides of the channel region 42c, a region that overlaps with the gate insulating layer 62 but does not overlap with the gate electrode 73 (hereinafter, a "side region", also referred to as an offset region) 42f is formed.

On the other hand, in the connection section formation region Rg, the upper connection section 73g that is in contact with the lower connection section 22g in the contact hole CHg is formed by patterning the second conductive film. The upper connection section 73g is electrically connected to the gate electrode 73. In this example, the upper connection section 73g is an extending portion of the gate electrode 73. In this manner, the gate connection section GC is obtained.

As the second conductive film, a metal such as molybdenum (Mo), tungsten (W), aluminum (Al), copper (Cu), titanium (Ti), or tantalum (Ta), or an alloy thereof can be used, for example. The second conductive film may have a layered structure including a plurality of layers formed of different conductive materials. Here, as the second conductive film, a Cu/Cu alloy layered film having a Cu alloy film as a lower layer and a Cu film as an upper layer is used. Alternatively, a Cu/Ti layered film or a Cu/Mo layered film may be used.

Thereafter, processing for lowering the resistance of the layered oxide semiconductor film may be performed using the first insulating film L1 and the second metal layer M2 as a mask. Plasma processing may be performed as the processing for lowering the resistance, for example. In the present embodiment, the resistance of a desired region of the oxide semiconductor layer 42 can be made low, while suppressing the oxide semiconductor layer 41 from being low-resistive by the channel protection layer 61. When viewed from the normal direction of the main surface of the substrate 1, a region (second region) b2 of the oxide semiconductor layer 42, which does not overlap with the first insulating film L1 (including the gate insulating layer 62), is a low-resistive region having a lower specific resistance than specific resistances of regions (hereinafter, sometimes referred to as "high-resistive regions") a1, b1 of the oxide semiconductor layers 41, 42, which overlap with the first insulating film L1. The low-resistive region may be a conductive region (for example, sheet resistance equal to or less than 200Ω/□). In this example, the regions of the oxide semiconductor layer 42, which are exposed by the openings 53, 54 of the first insulating film L1, are made low-resistive to be the second regions b2. In this case, when viewed from the normal direction of the substrate 1, the second regions b2 may each be surrounded by the first region b1.

In the example illustrated in FIG. 14, in the processing for lowering the resistance, in portions of the oxide semiconductor layers 41, 42, which are covered with both the first insulating film L1 and the second metal layer M2, the second metal layer M2 also functions as a mask, and thus the portions can each maintain a higher specific resistance than portions of the oxide semiconductor layers 41, 42 covered only with the first insulating film L1. Accordingly, when viewed from the normal direction of the substrate 1, the specific resistance of the channel region 42c of the oxide semiconductor layer 42, which overlaps with both the gate insulating layer 62 and the gate electrode 73, can be greater than the specific resistance of the side region 42f that overlaps with only the gate insulating layer 62, and the specific resistance of the first region a1 of the oxide semiconductor layer 41, which overlaps with the channel protection layer 61. This results in an advantage that the characteristic of a saturation region of the Id-Vd curve is more stabilized.

The plasma processing may be performed using the first insulating film L1 as a mask before forming the second metal layer M2. As a result, all regions exposed by the openings 51 to 54 of the insulating layer 60 among the oxide semiconductor layers 41, 42 can be made low-resistive.

The method of the processing for lowering the resistance is not limited to the plasma processing. For example, the resistance of the exposed region of the oxide semiconductor layer 42 can also be lowered by bringing the region into contact with a conductive film such as a metal film, or a reducing insulating film that can reduce an oxide semiconductor.

Figure 6F:
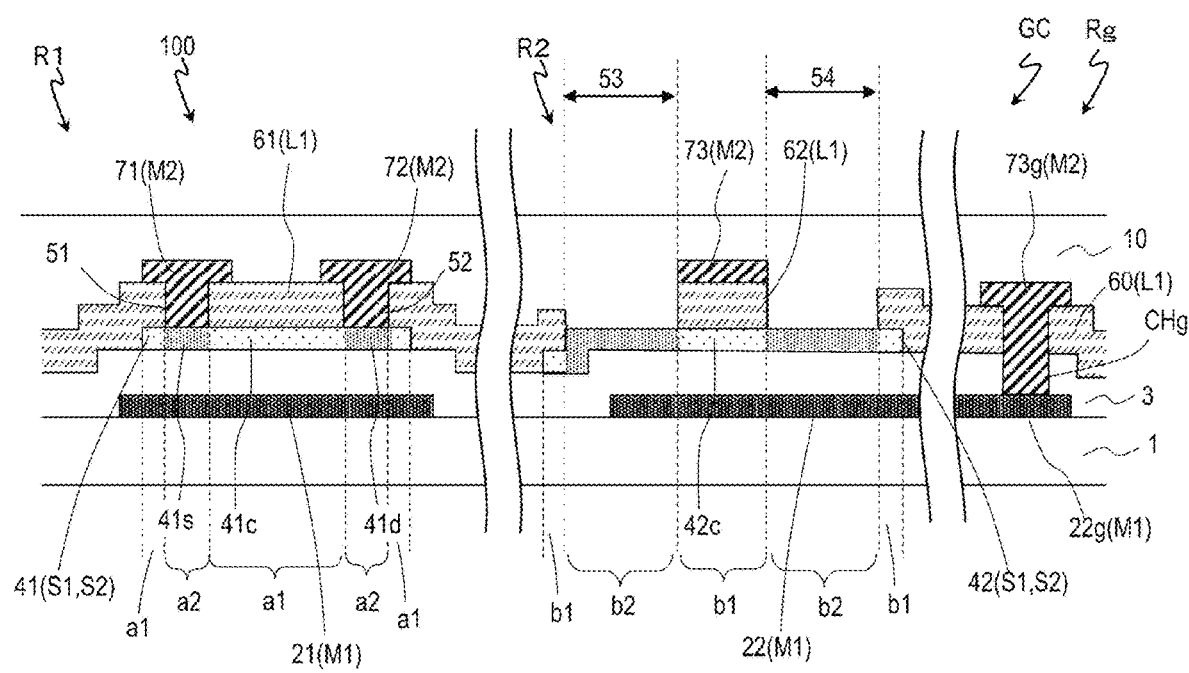
FIG. 6F is a process cross-sectional view illustrating the manufacturing method of the active matrix substrate.

STEP 6: Formation of Interlayer Insulating Layer 10 (FIG. 6F)

Subsequently, the interlayer insulating layer 10 covering the oxide semiconductor layers 41, 42 and the second metal layer M2 is formed. The interlayer insulating layer 10 may be in contact with the second region (a region exposed from the first insulating film L1) b2 of the oxide semiconductor layer 42.

The interlayer insulating layer 10 can be formed with a single-layer or a multi-layer of an inorganic insulating layer such as a silicon oxide film, a silicon nitride film, a silicon oxynitride film, a silicon nitride oxide film and the like. The thickness of the inorganic insulating layer may be 100 nm or more and 500 nm or less. Here, an SiNx layer (having a thickness of 300 nm) is formed as the interlayer insulating layer 10 by the CVD.

In this example, an insulating film such as a silicon nitride film that reduces an oxide semiconductor is used as the interlayer insulating layer 10. In this case, the specific resistance of the second region b2 can be kept low by disposing the interlayer insulating layer 10 in direct contact with the second region b2 of the oxide semiconductor layer 42.

Figure 6G:
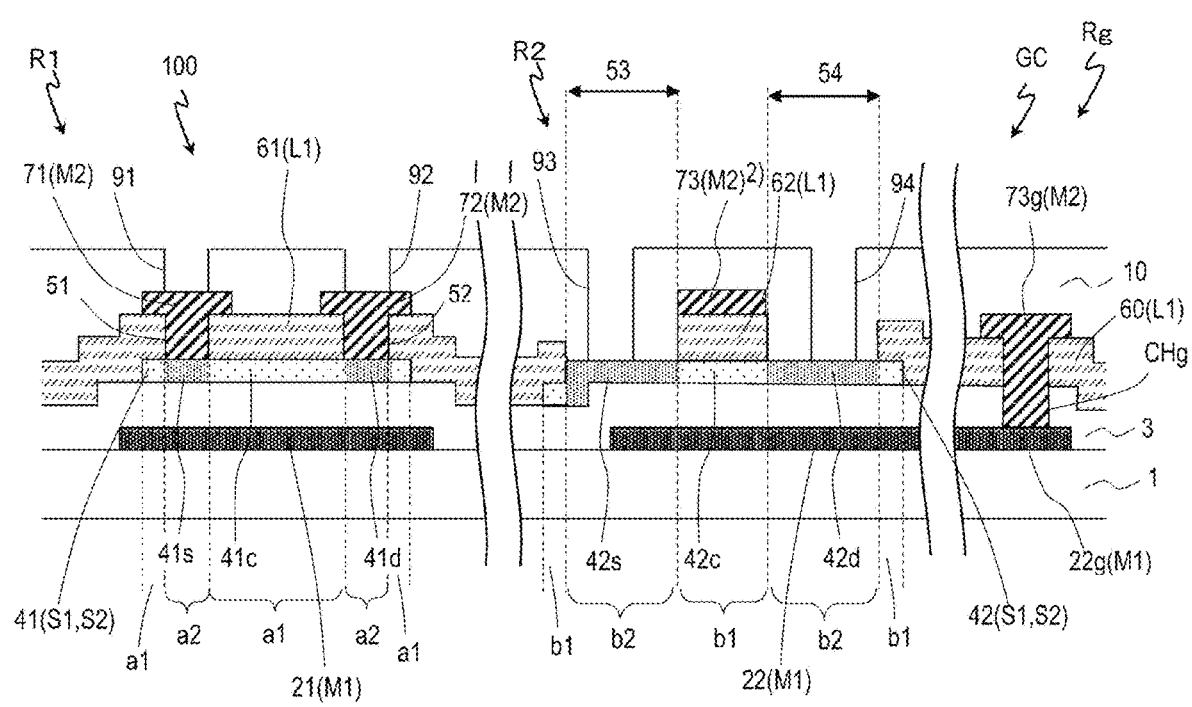
FIG. 6G is a process cross-sectional view illustrating the manufacturing method of the active matrix substrate.

STEP 7: Patterning of Interlayer Insulating Layer 10 (FIG. 6G)

Thereafter, the interlayer insulating layer 10 is patterned by the known photolithography step. Thereby, as illustrated in FIG. 6G, in the TFT formation region R1, the opening 91 that exposes a part of the source electrode 71 and the opening 92 that exposes a part of the drain electrode 72 are formed in the interlayer insulating layer 10. In the TFT formation region R2, the opening 93 and the opening 94 that expose a part of the second region b2 of the oxide semiconductor layer 42 are formed in the interlayer insulating layer 10. When viewed from the normal direction of the substrate 1, the openings 93, 94 may be located inside the openings 53, 54 formed in the first insulating film L1.

STEP 8: Formation of Third Metal Layer M3 (FIGS. 5A and 5B)

Subsequently, a third conductive film (having a thickness of 50 nm or more and 500 nm or less, for example) (not illustrated) is formed on the interlayer insulating layer 10, and the third conductive film is patterned. As a result, as illustrated in FIGS. 5A and 5B, the upper source electrode 81 and the upper drain electrode 82 are formed in the TFT formation region R1, and the source electrode 83 and the drain electrode 84 are formed in the TFT formation region R2. The upper source electrode 81 and the upper drain electrode 82 may be in contact with the source electrode 71 and the drain electrode 72 in the openings 91, 92, respectively. The source electrode 83 and the drain electrode 84 are connected to parts of the second region b2 of the oxide semiconductor layer 42 in the openings 93, 94, respectively. Accordingly, the second TFT 200 is obtained in the TFT formation region R2.

In this manner, the active matrix substrate 1000a can be manufactured.

As the source conductive film, an element selected from aluminum (Al), chromium (Cr), copper (Cu), tantalum (Ta), titanium (Ti), molybdenum (Mo), and tungsten (W), or an alloy containing these elements as components can be used. For example, the third conductive film may have a triple-layer structure of titanium film-aluminum film-titanium film, or a triple-layer structure of molybdenum film-aluminum film-molybdenum film can be used. Note that the source conductive film is not limited to the triple-layer structure, and may have a single-layer or a dual-layer structure, or a layered structure of four or more layers. Here, a layered film having a Ti film (having a thickness of from 15 to 70 nm) as a lower layer and having a Cu film (having a thickness of from 50 to 400 nm) as an upper layer is used.

A modified example of the method for manufacturing the active matrix substrate will be described below. Hereinafter, points different from the above method will be mainly described, and the description of the same steps will be omitted.

FIGS. 7A to 7D are process cross-sectional views for explaining another method for manufacturing the active matrix substrate.

Figure 7A:
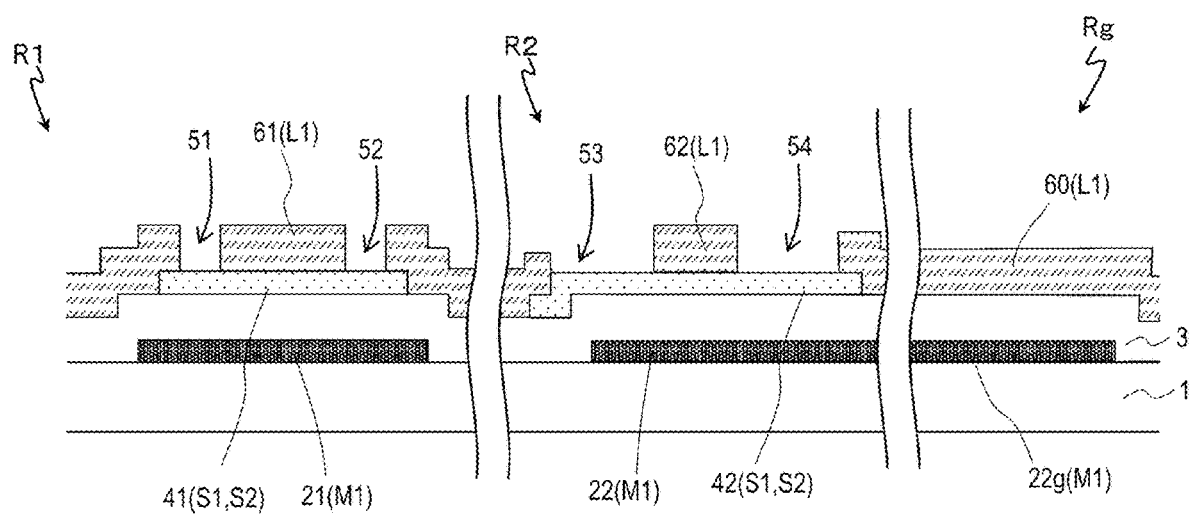
FIG. 7A is a process cross-sectional view illustrating another manufacturing method of the active matrix substrate.

First, similarly to the method described above, the first metal layer M1, the lower insulating layer 3, the oxide semiconductor layer 41, and the oxide semiconductor layer 42 are formed. Next, as illustrated in FIG. 7A, the first insulating film L1 is formed and patterned to obtain an insulating layer including the channel protection layer 61 and the gate insulating layer 62. This example is different from the process illustrated in FIG. 6D in that in the connection section formation region Rg, no contact hole is formed in the first insulating film L1 and the lower insulating layer 3.

Figure 7B:
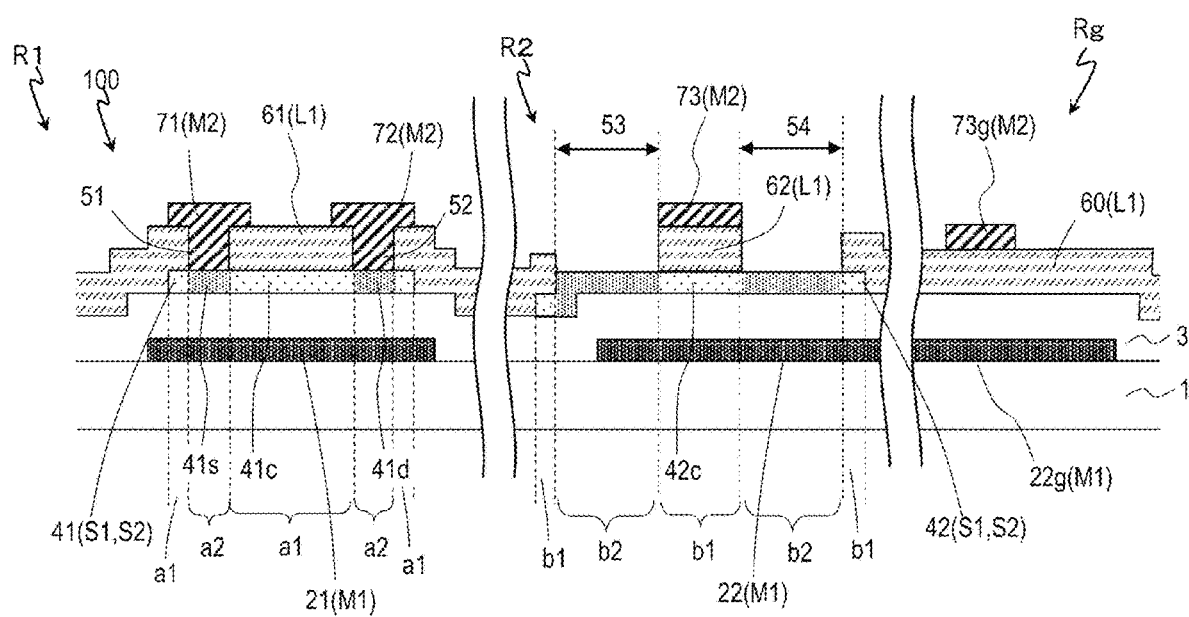
FIG. 7B is a process cross-sectional view illustrating the other manufacturing method of the active matrix substrate.

Next, the second conductive film is formed so as to cover the first insulating film L1, and patterned to form the second metal layer M2 including the source electrode 71, the drain electrode 72, the gate electrode 73, and the upper connection section 73g as illustrated in FIG. 7B. The upper connection section 73g may be connected to (formed integrally with) the gate electrode 73.

Figure 7C:
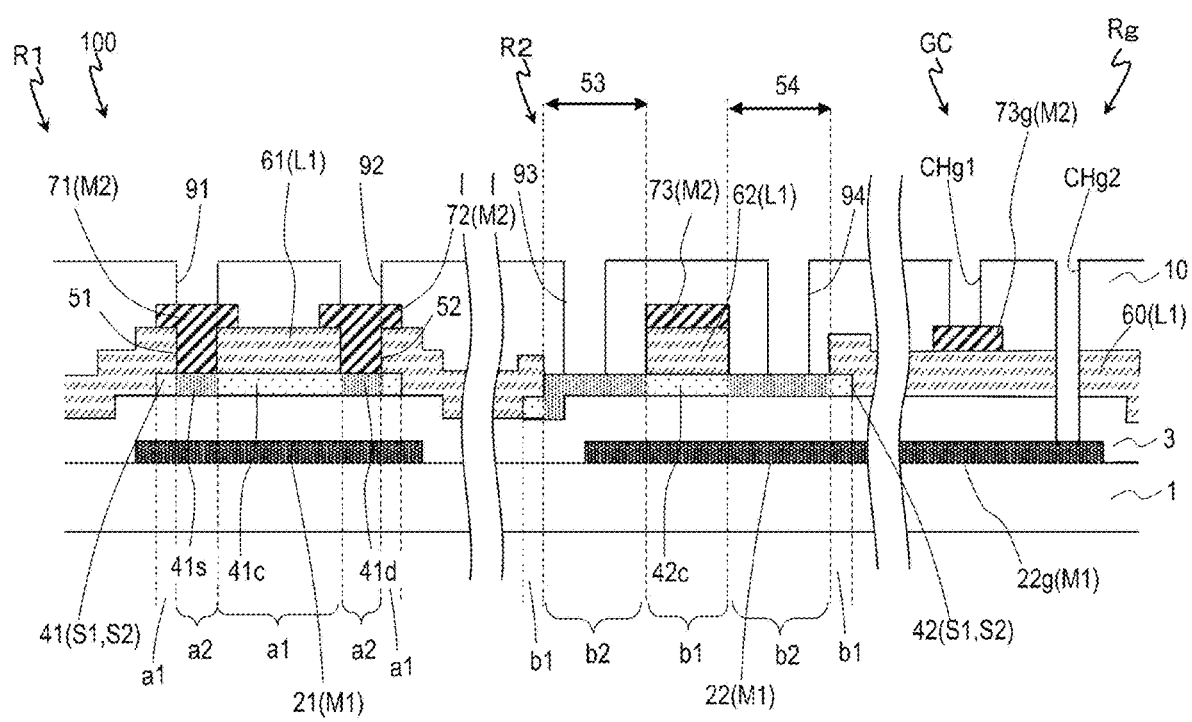
FIG. 7C is a process cross-sectional view illustrating the other manufacturing method of the active matrix substrate.

Thereafter, as illustrated in FIG. 7C, the interlayer insulating layer 10 is formed so as to cover the second metal layer M2, and patterned. At this time, in the connection section formation region Rg, the opening CHg1 that exposes a part of the upper connection section 73g is formed in the interlayer insulating layer 10, and the interlayer insulating layer 10, the first insulating film L1, and the lower insulating layer 3 are etched simultaneously (collectively) to form an opening CHg2 that exposes a part of the lower connection section 22g.

Figure 7D:
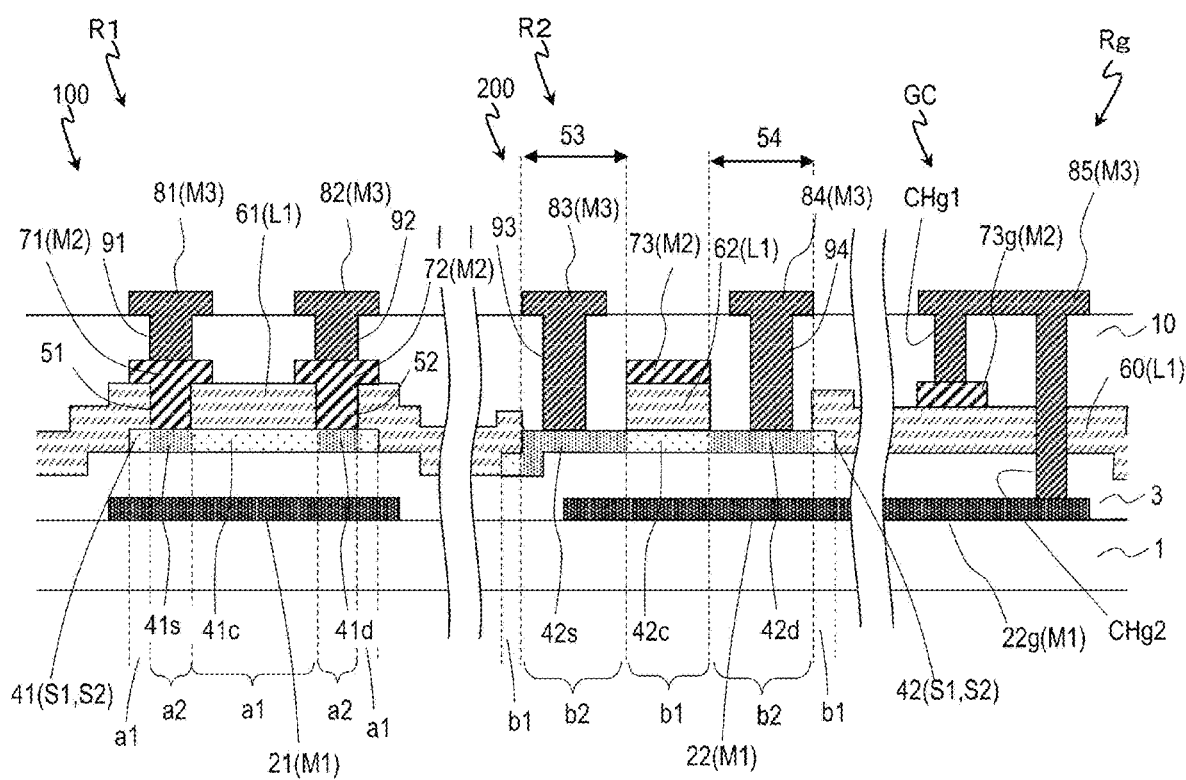
FIG. 7D is a process cross-sectional view illustrating the other manufacturing method of the active matrix substrate.

Next, a third conductive film is formed and patterned to form the third metal layer M3 including the upper source electrode 81, the upper drain electrode 82, the source electrode 83, the drain electrode 84, and a connection electrode 85, as illustrated in FIG. 7D. The connection electrode 85 is connected to the upper connection section 73g in the opening CHg1, and is connected to the lower connection section 22g in the opening CHg2. As a result, the gate connection section GC is obtained. In the gate connection section GC, the upper connection section 73g is electrically connected to the lower connection section 22g via the connection electrode 85. Note that the connection electrode 85 only needs to be formed of a conductive film located in an upper layer of the second metal layer M2 and does not need to be formed in the third metal layer M3. For example, a transparent conductive film for forming a pixel electrode may be used to form the connection electrode.

Figure 8A:
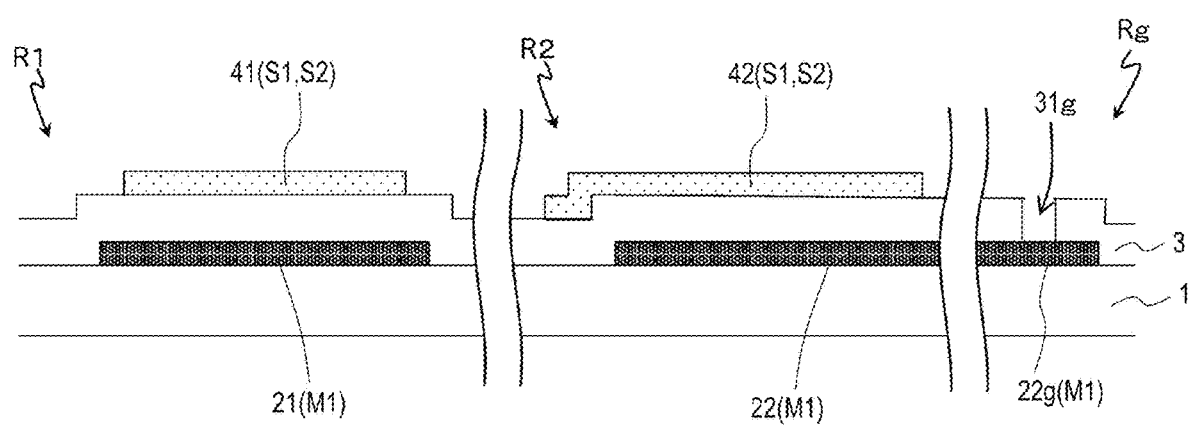
FIG. 8A is a process cross-sectional view illustrating yet another manufacturing method of the active matrix substrate.
Figure 8B:
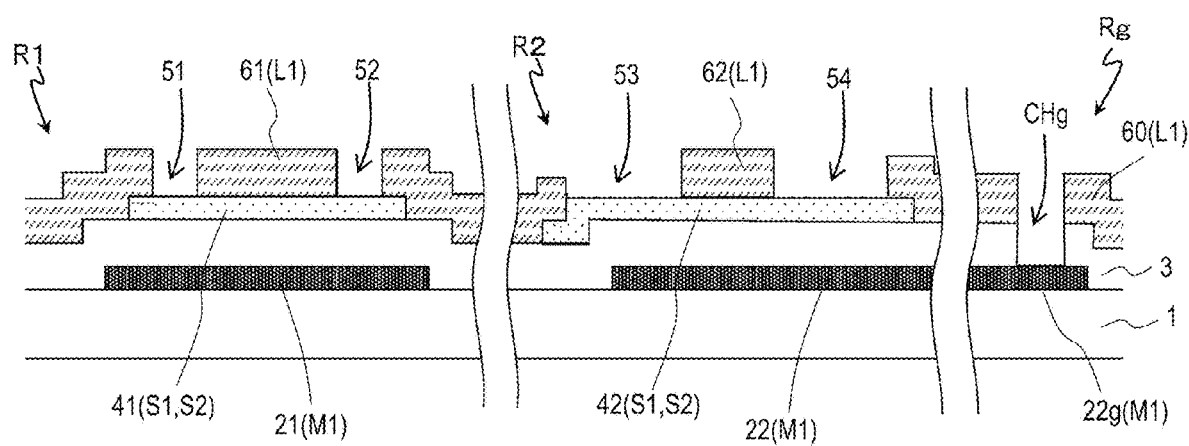
FIG. 8B is a process cross-sectional view illustrating the yet other manufacturing method of the active matrix substrate.
Figure 8C:
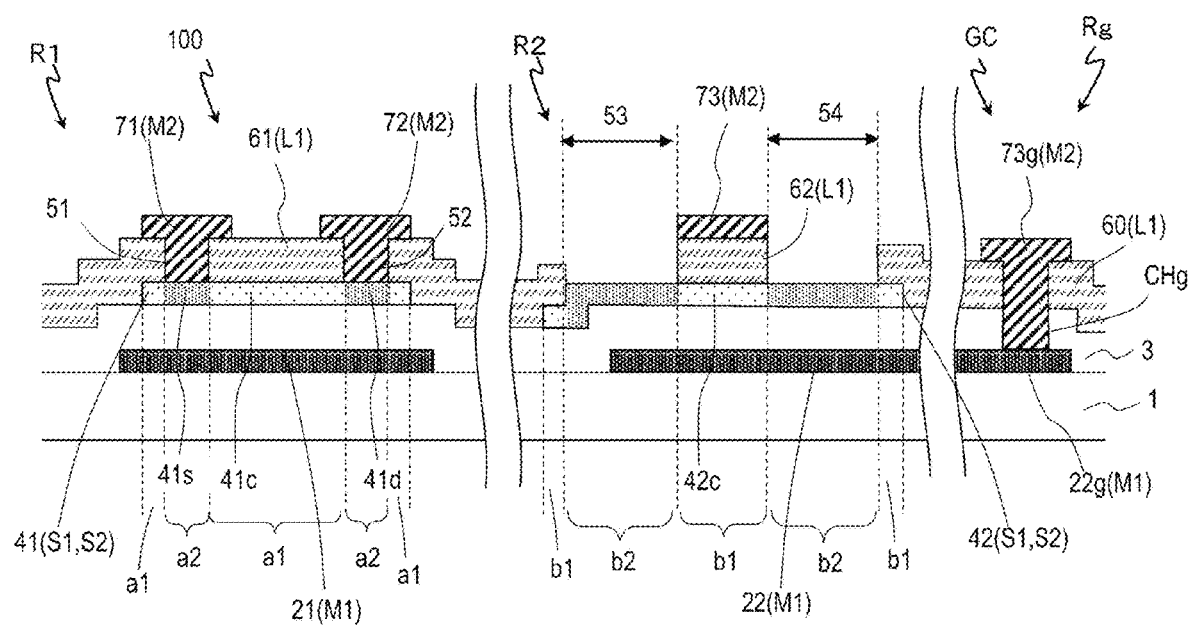
FIG. 8C is a process cross-sectional view illustrating the yet other manufacturing method of the active matrix substrate.

FIGS. 8A to 8C are process cross-sectional views for explaining yet another method for manufacturing the active matrix substrate.

First, after forming the first metal layer M1 in a manner similar to that described above, as illustrated in FIG. 8A, the lower insulating layer 3 is formed. In this example, the lower insulating layer 3 is patterned to provide an opening 31g that exposes a part of the lower connection section 22g in the connection section formation region Rg.

Next, as illustrated in FIG. 8B, the first insulating film L1 is formed. Thereafter, a resist layer (not illustrated) is formed on the first insulating film L1, and the first insulating film L1 is patterned using the resist layer as a mask to obtain an insulating layer including the channel protection layer 61 and the gate insulating layer 62. In addition, in the connection section formation region Rg, the contact hole CHg that exposes a part of the lower connection section 22g is formed in the first insulating film L1 and the lower insulating layer 3. The contact hole CHg may have a larger size than the opening 31g. In this example, the resist layer (not illustrated) may have an opening region that at least partially overlaps with the opening 31g in the connection section formation region Rg, when viewed from the normal direction of the substrate 1. The opening 31g is preferably located inside the opening region of the resist layer, when viewed from the normal direction of the substrate 1.

According to the present modified example, the contact hole CHg is formed by two-stage etching, and thus the etching time of the first insulating film L1 can be made shorter than in the method described above with reference to FIG. 6D. Accordingly, the contact hole CHg extending through the first insulating film L1 and the lower insulating layer 3 is obtained while suppressing damage to the oxide semiconductor layers 41, 42.

Subsequently, similarly to the method described above with reference to FIG. 6E, the second conductive film that covers the first insulating film L1 is formed and patterned to form the second metal layer M2 including the source electrode 71, the drain electrode 72, the gate electrode 73, and the upper connection section 73g, as illustrated in FIG. 8C. The upper connection section 73g is connected to the lower connection section 22g in the contact hole CHg.

The subsequent steps are similar to those of the method described above with reference to FIGS. 6F to 6G, and thus description thereof is omitted.

Structure 1 of Active Matrix Substrate

A structure of an active matrix substrate used in a liquid crystal display device will be described with reference to the drawings.

Figure 9:
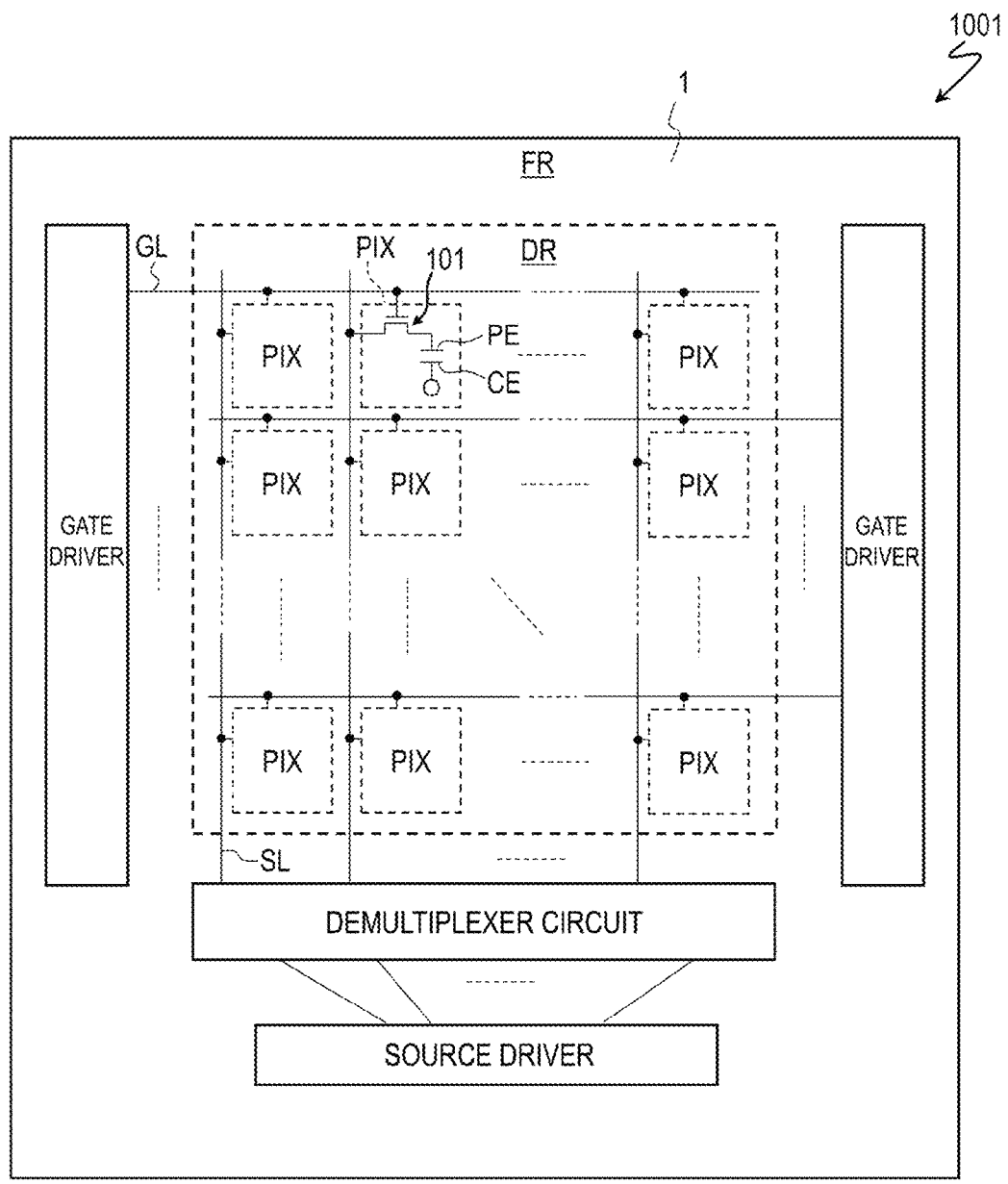
FIG. 9 is a schematic view illustrating an example of a planar structure of an active matrix substrate 1001.

FIG. 9 is a schematic diagram illustrating an example of a planar structure of an active matrix substrate 1001 according to the present embodiment.

The active matrix substrate 1001 has a display region DR, and a region (a non-display region or a frame region) FR other than the display region DR. The display region DR is constituted of a plurality of pixel areas PIX arranged in a matrix shape. Each of the plurality of pixel areas PIX (also simply referred to as a "pixel") is an area corresponding to a pixel of the display device. The non-display region FR is a region positioned in a periphery of the display region DR and does not contribute to display.

In the non-display region FR, for example, a gate driver, a demultiplexer circuit, and the like are integrally (monolithically) provided. A source driver is mounted on the active matrix substrate 1001, for example.

In the display region DR, a plurality of gate bus lines GL extending in a row direction (x direction), and a plurality of source bus lines SL extending in a column direction (y direction) are formed. Each of the plurality of pixel areas PIX is defined by the gate bus line GL and the source bus line SL, for example. The gate bus lines GL are connected to respective terminals of the gate driver. The source bus lines SL are connected to respective terminals of the source driver.

Each pixel area PIX is provided with a pixel TFT 101 and a pixel electrode PE. A gate electrode of the pixel TFT 101 is electrically connected to the corresponding gate bus line GL, and a source electrode is electrically connected to the corresponding source bus line SL. A drain electrode is electrically connected to the pixel electrode PE. When the active matrix substrate 1001 is applied to a display device in a transverse electrical field mode such as a fringe field switching (FFS) mode, although not illustrated, the active matrix substrate 1001 is provided with an electrode common to the plurality of pixels (common electrode).

A plurality of peripheral circuit TFTs constituting the peripheral circuits such as a drive circuit and a demultiplexer circuit are formed in the non-display region of the active matrix substrate 1001. Each of the peripheral circuit TFTs includes a drive circuit TFT constituting the gate driver, a DMX circuit TFT constituting the demultiplexer circuit, and the like.

The active matrix substrate 1001 includes the first TFT and the second TFT described above. The first TFT having a bottom gate structure may be used as the pixel TFT 101 in which off-leakage of current is required to be small, and the second TFT having a top gate structure may be used in some peripheral circuit TFTs (e.g., a DMX circuit TFT, an output transistor in a gate driver, or the like).

Figure 10A:
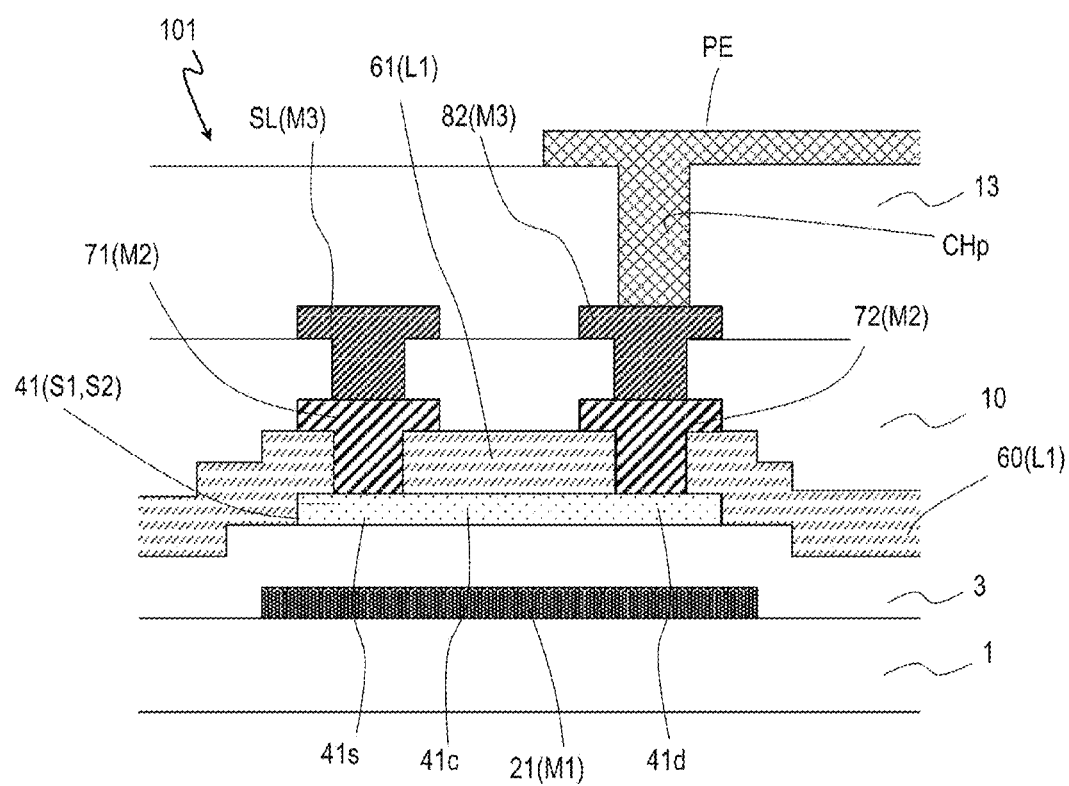
FIG. 10A is a cross-sectional view illustrating a pixel TFT 101 in the active matrix substrate 1001.

FIG. 10A is a cross-sectional view illustrating an example of the pixel TFT 101.

The pixel area PIX includes a pixel electrode PE disposed on the third metal layer M3 with the upper insulating layer 13 interposed therebetween. The upper insulating layer 13 may include, for example, an inorganic insulating layer and an organic insulating layer disposed on the inorganic insulating layer. The pixel electrode PE is formed of, for example, a transparent conductive film of a metal oxide such as indium-zinc oxide, indium-tin oxide (ITO), ZnO, or the like. Further, the source bus line SL is formed in the third metal layer M3, for example.

The pixel TFT 101 is disposed in the pixel area PIX. The pixel TFT 101 is the first TFT described above. The source electrode 71 of the pixel TFT 101 is electrically connected to the source bus line SL. The source electrode 71 may be connected to the source bus line SL in the third metal layer M3. The drain electrode 72 is connected to the upper drain electrode 82 in the third metal layer M3, for example. The upper drain electrode 82 is electrically connected to the pixel electrode PE in the contact hole CHp formed in the upper insulating layer 13. Note that the pixel electrode PE may be directly connected to the drain electrode 72. Alternatively, the source electrode and the drain electrode may be formed in the third metal layer M3 (see FIG. 4).

Figure 10B:
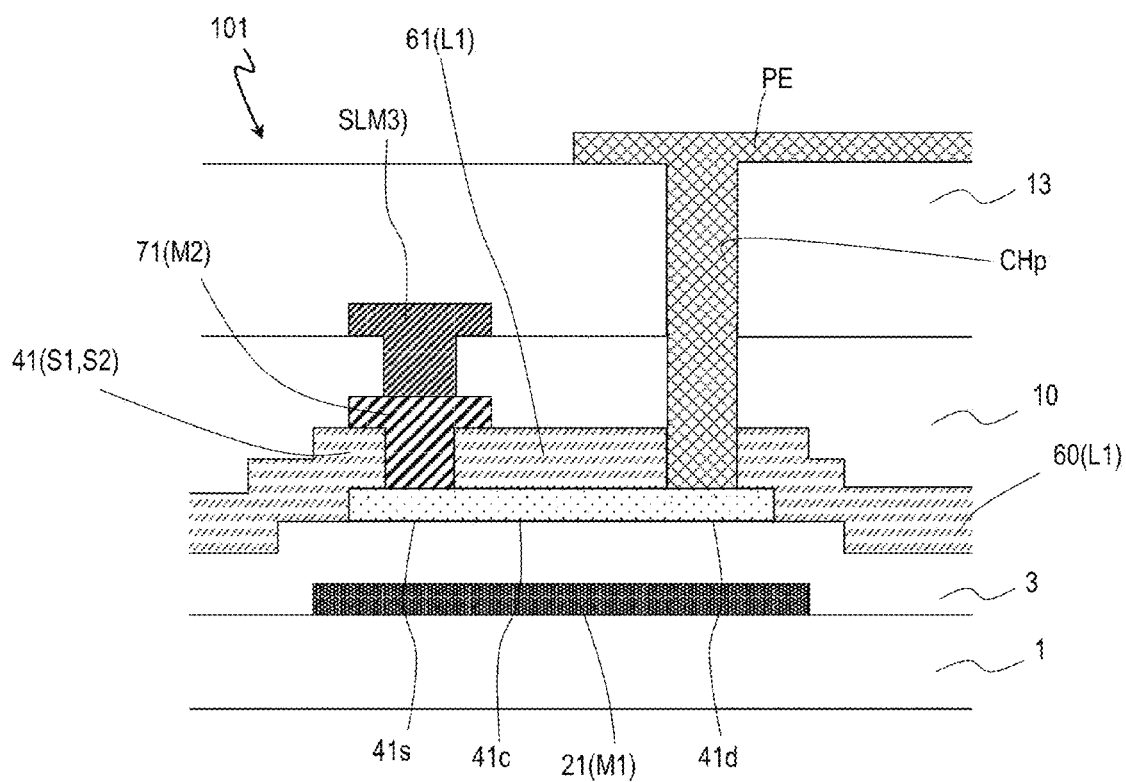
FIG. 10B is a cross-sectional view illustrating another example of the pixel TFT 101 in the active matrix substrate 1001.

Note that, as illustrated in FIG. 10B, the oxide semiconductor layer 41 of the pixel TFT 101 may be in direct contact with the pixel electrode PE in the contact hole CHp formed in the channel protection layer 61, the interlayer insulating layer 10, and the upper insulating layer 13.

Structure 2 of Active Matrix Substrate

A structure of an active matrix substrate used in an organic EL display device will be described with reference to the drawings.

Figure 11:
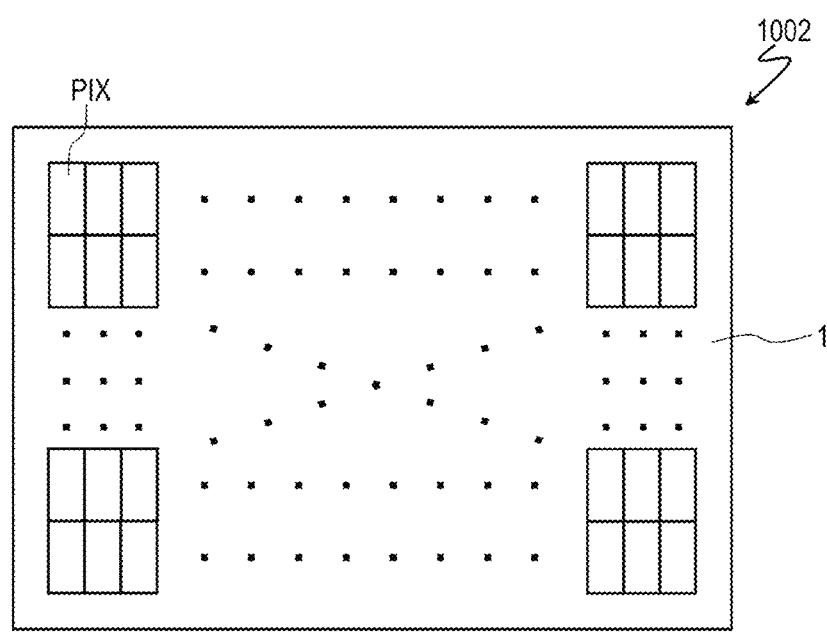
FIG. 11 is a schematic view illustrating an example of a planar structure of an active matrix substrate 1002.

FIG. 11 is a schematic diagram illustrating an example of a planar structure of an active matrix substrate 1002 according to the present embodiment.

The active matrix substrate 1002 differs from the active matrix substrate 1001 in that each pixel area PIX includes a plurality of pixel TFTs. Hereinafter, the points different from the active matrix substrate 1001 will be mainly described, and the description of the same structure will be omitted.

The active matrix substrate 1002 includes a plurality of pixel areas PIX arranged in a matrix shape. The plurality of pixel areas PIX typically include pixel areas corresponding to red pixels that display red, green pixels that display green, and blue pixels that display blue.

Figure 12:
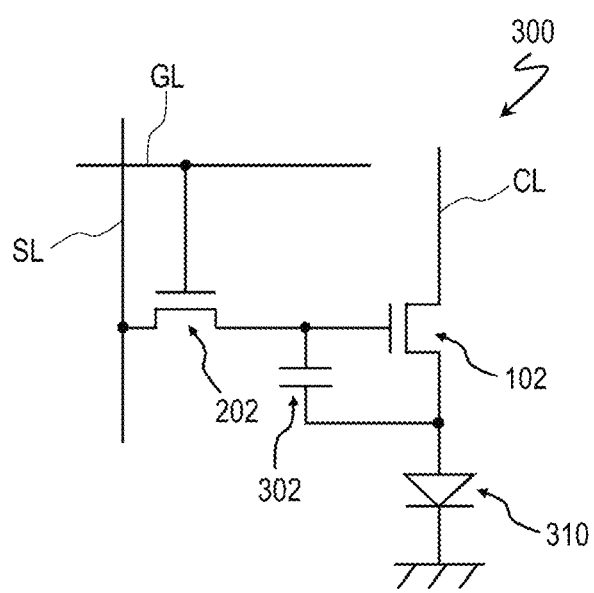
FIG. 12 is a diagram illustrating a pixel circuit 300.

Each of the plurality of pixel areas PIX includes the substrate 1 and a pixel circuit provided on the substrate 1. FIG. 12 illustrates an example of the pixel circuit.

A pixel circuit 300 illustrated in FIG. 12 includes a drive pixel TFT 102, a selection pixel TFT 202, and a capacitance element (holding capacitor) 302. The drive pixel TFT 102 is the first TFT, and the selection pixel TFT 202 is the second TFT.

A gate electrode of the selection pixel TFT 202 is connected to the gate bus line GL. A source electrode of the selection pixel TFT 202 is connected to the source bus line SL. A drain electrode of the selection pixel TFT 202 is connected to a gate electrode of the drive pixel TFT 102 and the capacitance element 302. A source electrode of the drive pixel TFT 102 is connected to a current supply line CL. A drain electrode of the drive pixel TFT 102 is connected to an organic light emitting diode (OLED) 310 formed on the active matrix substrate 1002.

When an ON signal is supplied from the gate bus line GL to the gate electrode of the selection pixel TFT 202, the selection pixel TFT 202 is brought into an ON state, and thus a signal voltage from the source bus line SL (corresponding to desired light emission luminance of the OLED 80) is applied to the capacitance element 302 and the gate electrode of the drive pixel TFT 102 via the selection pixel TFT 202. When the drive pixel TFT 102 is brought into the ON state by the signal voltage, a current from the current supply line CL flows through the drive pixel TFT 102 to the OLED 310, and then the OLED 310 emits light.

According to the present embodiment, a plurality of oxide semiconductor TFTs (here, the drive pixel TFT 102 and the selection pixel TFT 202) having different required characteristics can be produced separately in the pixel circuit 300. Specifically, in order to more reliably control the current as the drive pixel TFT 102, the first TFT having a gentler Vg-Id characteristic (having a larger S value) is used as the drive pixel TFT 102, and the second TFT having a large current driving force is used as the selection pixel TFT 202. The selection pixel TFT 202 preferably has a double gate structure (see FIGS. 5A and 5B).

Figure 13:
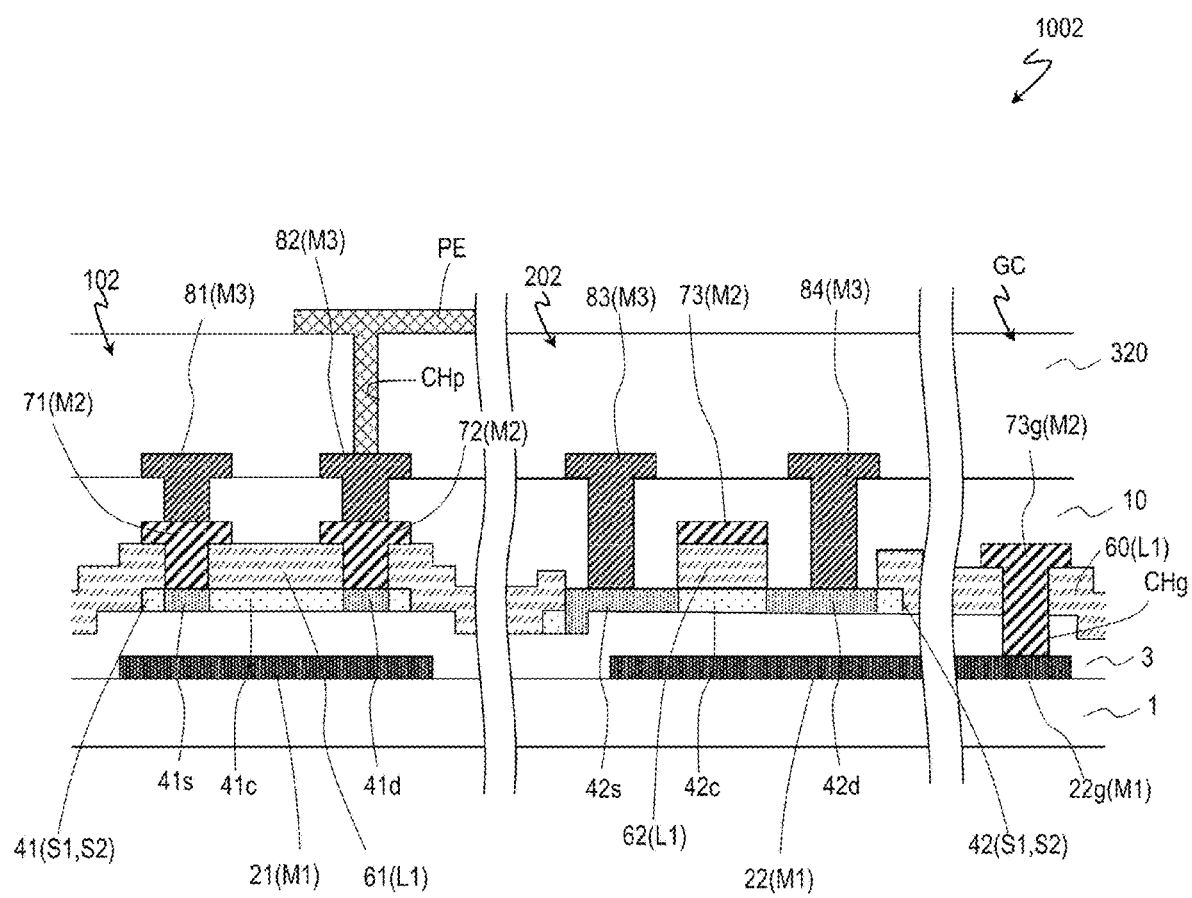
FIG. 13 is a cross-sectional view illustrating a drive pixel TFT 102 and a selection pixel TFT 202 in the active matrix substrate 1002.

FIG. 13 is a cross-sectional view illustrating the drive pixel TFT 102 and the selection pixel TFT 202 in the active matrix substrate 1002.

The drive pixel TFT 102 and the selection pixel TFT 202 have the same structures as the first TFT and the second TFT, respectively.

A flattened layer 320 is provided on the drive pixel TFT 102 and the selection pixel TFT 202. A pixel electrode PE is provided on the flattened layer 320. The drain electrode 72 of the drive pixel TFT 102 is electrically connected to the pixel electrode PE. Note that when the active matrix substrate 1002 is applied to a color filter organic EL display device, a color filter layer (not illustrated) is further provided on the flattened layer 320. A bank (not illustrated) formed of an insulating material is provided between adjacent pixel areas on the flattened layer 320 and the pixel electrode PE. Further, although not illustrated, an organic EL layer is arranged on the pixel electrode PE, and an upper layer electrode is provided on the organic EL layer. For example, the pixel electrode PE functions as an anode electrode and the upper layer electrode functions as a cathode electrode.

Note that the configuration of the pixel circuit is not limited to the configuration illustrated in FIG. 12. Each pixel circuit may have three or more TFTs. Even in this case, the first TFT may be used as at least the drive pixel TFT 102 and for other TFTs, the first TFT or the second TFT may be used depending on the use.

Table 1 exemplifies suitable characteristics of the drive pixel TFT and the selection pixel TFT in the pixel circuit and the drive circuit TFT for the organic EL display devices. The characteristics and numerical ranges set forth in Table 1 are examples, and are not limited to the characteristics of each TFT.

TABLE 1

| Use of TFT | Drive pixel TFT in pixel circuit | Selection pixel TFT in pixel circuit | Output transistor in drive circuit |
| --- | --- | --- | --- |
| Threshold voltage | Enhancement 1 V or more | Depletion to enhancement −1 V or more | Enhancement 0 V or more |
| Mobility | Low to medium 10 cm$^2$/Vs or less | High 20 cm$^2$/Vs or more | High 20 cm$^2$/Vs or more |
| S value | Large | Small | Small |
| TFT structure | Second TFT | First TFT | First TFT |

Oxide Semiconductor

The oxide semiconductor included in the oxide semiconductor layer of each TFT according to the present embodiment may be an amorphous oxide semiconductor or a crystalline oxide semiconductor including a crystalline portion. Examples of the crystalline oxide semiconductor include a polycrystalline oxide semiconductor, a microcrystalline oxide semiconductor, a crystalline oxide semiconductor having a c-axis oriented substantially perpendicular to the layer surface and the like.

The oxide semiconductor layer may have a layered structure including two or more layers. When the oxide semiconductor layer has the layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. The oxide semiconductor layer may include a plurality of amorphous oxide semiconductor layers. In a case where the oxide semiconductor layer has a dual-layer structure including an upper layer and a lower layer, an energy gap of the oxide semiconductor included in a layer positioned on the gate electrode side of the dual-structure (that is the lower layer in the case of the bottom gate structure, and the upper layer in the case of the top gate structure) may be smaller than an energy gap of the oxide semiconductor included in a layer positioned opposite to the gate electrode (that is the upper layer in the case of the bottom gate structure, and the lower layer in the case of the top gate structure). However, in a case where a difference in the energy gap between these layers is relatively small, the energy gap of the oxide semiconductor included in the layer positioned on the gate electrode side may be greater than the energy gap of the oxide semiconductor included in the layer positioned opposite to the gate electrode.

Materials, structures, and film formation methods of an amorphous oxide semiconductor and the above-described crystalline oxide semiconductors, a configuration of an oxide semiconductor layer having a layered structure, and the like are described in, for example, JP 2014-007399 A. The entire contents of the disclosure of JP 2014-007399 A are incorporated herein by reference.

The oxide semiconductor layer may include, for example, at least one metal element selected from In, Ga, and Zn. In the present embodiment, the oxide semiconductor layer includes, for example, an In—Ga—Zn—O based semiconductor (for example, an indium gallium zinc oxide). Here, the In—Ga—Zn—O based semiconductor is a ternary oxide of indium (In), gallium (Ga), and zinc (Zn), and a ratio (composition ratio) of In, Ga, and Zn is not particularly limited. For example, the ratio includes In:Ga:Zn=2:2:1, In:Ga:Zn=1:1:1, In:Ga:Zn=1:1:2 or the like. Such an oxide semiconductor layer can be formed of an oxide semiconductor film including an In—Ga—Zn—O based semiconductor.

The In—Ga—Zn—O based semiconductor may be an amorphous semiconductor or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Note that a crystal structure of the crystalline In—Ga—Zn—O based semiconductor is disclosed in, for example, JP 2014-007399 A, JP 2012-134475 A, and JP 2014-209727 A as described above. The entire contents of the disclosure of JP 2012-134475 A and JP 2014-209727 A are incorporated herein by reference. A TFT including an In—Ga—Zn—O based semiconductor layer has a high mobility (more than 20 times as compared to an a-Si TFT) and a low leakage current (less than 1/100 as compared to the a-Si TFT). Thus, such a TFT can be suitably used as a driving TFT (for example, a TFT included in a drive circuit provided in a periphery of a display region including a plurality of pixels, and on the same substrate as the display region) and a pixel TFT (TFT provided in a pixel).

In place of the In—Ga—Zn—O based semiconductor, the oxide semiconductor layer may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of indium (In), tin (Sn), and zinc (Zn). Alternatively, the oxide semiconductor layer may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, cadmium oxide (CdO), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, an In—W—Zn—O based semiconductor, and the like.

INDUSTRIAL APPLICABILITY

The active matrix substrate according to the embodiments of the disclosure can be applied to various electronic devices such as a display device such as a liquid crystal display device, an organic electroluminescence (EL) display device, and an inorganic electroluminescence display device, an imaging device such as an image sensor device, an image input device, a fingerprint reader, and a semiconductor memory.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:
1. An active matrix substrate comprising:
a substrate; and
a plurality of oxide semiconductor TFTs supported by the substrate and including a first TFT and a second TFT,
wherein the first TFT includes
a first oxide semiconductor layer including a first channel region,
a first gate electrode disposed on the substrate side of the first oxide semiconductor layer with a lower insulating layer interposed between the first gate electrode and the first oxide semiconductor layer, the first gate electrode overlapping with the first channel region when viewed from a normal direction of the substrate,
a channel protection layer disposed on a side of the first oxide semiconductor layer opposite to the substrate and covering at least the first channel region, and
a first source electrode and a first drain electrode disposed in an upper layer of the channel protection layer and electrically connected to the first oxide semiconductor layer,
the second TFT includes
a second oxide semiconductor layer including a second channel region,
a second gate electrode disposed on a side of the second oxide semiconductor layer directed away from the substrate with a gate insulating layer interposed between the second gate electrode and the second oxide semiconductor layer, the second gate electrode overlapping with the second channel region when viewed from the normal direction of the substrate, and
a second source electrode and a second drain electrode disposed on an interlayer insulating layer covering the second gate electrode and electrically connected to the second oxide semiconductor layer,
the first oxide semiconductor layer and the second oxide semiconductor layer are formed of the same layered oxide semiconductor film,
the layered oxide semiconductor film has a layered structure including a high mobility oxide semiconductor film having a relatively high mobility and a low mobility oxide semiconductor film disposed on the substrate side of the high mobility oxide semiconductor film and having a lower mobility than a mobility of the high mobility oxide semiconductor film,
the channel protection layer of the first TFT and the gate insulating layer of the second TFT are formed of the same insulating film,
the first oxide semiconductor layer further includes a first source contact region and a first drain contact region located on both sides of the first channel region when viewed from the normal direction of the substrate,
the first source contact region is electrically connected to the first source electrode,
the first drain contact region is electrically connected to the first drain electrode,
the channel protection layer covers the first channel region of the first oxide semiconductor layer and exposes the first source contact region and the first drain contact region,
the second oxide semiconductor layer includes a second source contact region and a second drain contact region located on both sides of the second channel region when viewed from the normal direction of the substrate,
the second source contact region is electrically connected to the second source electrode,
the second drain contact region is electrically connected to the second drain electrode, the gate insulating layer covers a first region of the second oxide semiconductor layer, the first region including the second channel region, and exposes a second region including the second source contact region and the second drain contact region, in the second oxide semiconductor layer, the second region is a region having a lower specific resistance than a specific resistance of the first region, in the first oxide semiconductor layer, the first source contact region and the first drain contact region are regions having a lower specific resistance than a specific resistance of a portion covered with the channel protection layer, the first region includes the second channel region overlapping with the second gate electrode and a side region overlapping with the gate insulating layer but not overlapping with the second gate electrode, when viewed from the normal direction of the substrate, the side region is located between the second channel region and the second source contact region and the second drain contact region, and a specific resistance of the second channel region is greater than a specific resistance of the side region and a specific resistance of the first channel region.

2. The active matrix substrate according to claim 1, wherein a thickness of the lower insulating layer is larger than a thickness of the gate insulating layer.

3. The active matrix substrate according to claim 1, wherein the second TFT further includes a lower conductive layer formed of the same conductive film as the first gate electrode of the first TFT, and the lower conductive layer overlaps with at least a part of the second oxide semiconductor layer when viewed from the normal direction of the substrate.

4. The active matrix substrate according to claim 3, wherein the lower conductive layer is electrically connected to the second gate electrode and functions as a lower gate electrode of the second TFT.

5. The active matrix substrate according to claim 1, wherein at least one of the first source electrode or the first drain electrode of the first TFT is formed of the same conductive film as the second gate electrode of the second TFT.

6. The active matrix substrate according to claim 1, wherein at least one of the first source electrode or the first drain electrode of the first TFT and the second source electrode and the second drain electrode of the second TFT are formed of the same conductive film.

7. The active matrix substrate according to claim 1, wherein at least one of the first source electrode or the first drain electrode of the first TFT is an electrode formed of the same conductive film as the second gate electrode of the second TFT, and the electrode is electrically connected to an upper electrode formed of the same conductive film as the second source electrode and the second drain electrode of the second TFT.

8. The active matrix substrate according to claim 1, wherein the channel protection layer of the first TFT and the gate insulating layer of the second TFT are separated from each other.

9. The active matrix substrate according to claim 1, wherein the channel protection layer of the first TFT and the gate insulating layer of the second TFT are connected to each other.

10. The active matrix substrate according to claim 9, wherein the insulating film includes a source-side opening and a drain-side opening located on both sides of the gate insulating layer when viewed from the normal direction of the substrate, the source-side opening and the drain-side opening exposing a part of the second oxide semiconductor layer.

11. The active matrix substrate according to claim 1, further comprising:
a display region including a plurality of pixel areas; and
a non-display region arranged around the display region,
wherein each of the plurality of pixel areas includes a pixel circuit including a selection pixel TFT, a drive pixel TFT, and a capacitance element,
the drive pixel TFT is the first TFT, and
the selection pixel TFT is the second TFT.

12. The active matrix substrate according to claim 1, further comprising:
a display region including a plurality of pixel areas;
a non-display region arranged around the display region;
a pixel TFT arranged in each of the plurality of pixel areas; and
a peripheral circuit arranged in the non-display region and including a plurality of circuit TFTs,
wherein the pixel TFT is the first TFT, and
the plurality of circuit TFTs include the second TFT.

13. The active matrix substrate according to claim 1, wherein each of the low mobility oxide semiconductor film and the high mobility oxide semiconductor film includes an In—Ga—Zn—O based semiconductor, and
an atomic ratio of In to all metal elements in the high mobility oxide semiconductor film is greater than an atomic ratio of In to all metal elements in the low mobility oxide semiconductor film.

14. The active matrix substrate according to claim 1, wherein the high mobility oxide semiconductor film includes Sn, and
the low mobility oxide semiconductor film does not include Sn or includes Sn at a lower concentration than a concentration of Sn in the high mobility oxide semiconductor film.

15. The active matrix substrate according to claim 1, wherein the low mobility oxide semiconductor film and/or the high mobility oxide semiconductor film includes an In—Ga—Zn—O based semiconductor, and
the In—Ga—Zn—O based semiconductor includes a crystalline portion.

* * * * *